(12) United States Patent
Chida

(10) Patent No.: US 6,928,097 B2
(45) Date of Patent: Aug. 9, 2005

(54) EDGE EMITTING SEMICONDUCTOR LASER AND SEMICONDUCTOR LASER MODULE

(75) Inventor: Hiroaki Chida, Tokyo (JP)

(73) Assignee: NEC Corporation, Tokyo (JP)

( * ) Notice: Subject to any disclaimer, the term of this patent is extended or adjusted under 35 U.S.C. 154(b) by 213 days.

(21) Appl. No.: 10/247,652

(22) Filed: Sep. 20, 2002

(65) Prior Publication Data

US 2003/0057427 A1 Mar. 27, 2003

(30) Foreign Application Priority Data

Sep. 21, 2001 (JP) ........................................ 2001-288456

(51) Int. Cl.$^7$ ................................................. H01S 5/00
(52) U.S. Cl. ........................................... 372/46; 372/45
(58) Field of Search ..................................... 372/43–50

(56) References Cited

U.S. PATENT DOCUMENTS

| | | | | |
|---|---|---|---|---|
| 3,932,184 A | * | 1/1976 | Cohen et al. ................ | 430/321 |
| 4,679,200 A | * | 7/1987 | Matsui et al. ................. | 372/45 |
| 4,689,797 A | * | 8/1987 | Olshansky .................... | 372/45 |
| 4,783,788 A | * | 11/1988 | Gordon ........................ | 372/45 |
| 4,827,483 A | * | 5/1989 | Fukuzawa et al. ............ | 372/45 |
| 5,657,339 A | * | 8/1997 | Fukunaga ..................... | 372/50 |
| 6,014,396 A | * | 1/2000 | Osinski et al. ................ | 372/46 |

FOREIGN PATENT DOCUMENTS

| | | |
|---|---|---|
| JP | 5-267772 A | 10/1993 |
| JP | 8-23133 A | 1/1996 |
| JP | 8-86923 A | 4/1996 |
| JP | 8-340147 A | 12/1996 |
| JP | 9-289354 A | 11/1997 |
| JP | 9-307181 A | 11/1997 |
| JP | 2001-119098 A | 4/2001 |
| WO | WO 01/48874 A2 | 7/2001 |

OTHER PUBLICATIONS

R. Ito et al., "Semiconductor laser (basis and application)", published by Baihukan, 1989, pp. 97.
J. Guthrie et al., "Beam Instability in 980–nm Power Lasers: Experiment and Analysis", IEEE Photonics Technology Letters, vol. 6, No. 12, Dec. 1994, pp. 1409–1411.

* cited by examiner

*Primary Examiner*—Minsun Oh Harvey
*Assistant Examiner*—James Menefee
(74) *Attorney, Agent, or Firm*—Sughrue Mion, PLLC

(57) ABSTRACT

An edge emitting semiconductor laser suppresses the "beam steering" to raise its maximum output with a simple configuration. An optical waveguide serving as a resonator includes an active layer and a cladding layer. A first edge, to which one end of the waveguide is connected, serves as an emission edge. A second edge, to which the other end of the waveguide is connected, is located at an opposite side to the first edge. The waveguide includes at least two parts having different widths, one of the at least two parts being a fundamental mode section. Current injection suppressing means is provided for suppressing or controlling current injection into the active layer in at least part of the fundamental mode section. The current injection suppressing means is preferably made by a current blocking layer, a current-limiting masking layer, or a passive wave-guiding region.

24 Claims, 37 Drawing Sheets

EDGE EMITTING SEMICONDUCTOR LASER AND SEMICONDUCTOR LASER MODULE

BACKGROUND OF THE INVENTION

1. Field of the Invention

The present invention relates generally to semiconductor lasers (laser diodes). More particularly, the invention relates to an edge emitting semiconductor laser whose optical waveguide (which serves as an optical resonator) has parts with different widths, which suppresses the "beam steering" in the fundamental mode section of the waveguide to thereby raise the maximum fundamental-mode output, and a semiconductor laser module using the semiconductor laser.

2. Description of the Related Art

"Optical fiber amplifiers" play an important role as the relay or repeater in the wide-band optical communication system. Conventionally, an optical fiber doped with a rare-earth element has ever been used as the optical fiber amplifier. To excite the fiber of this type, a high-output semiconductor laser module is essential. A high-output, edge-emitting semiconductor laser (e.g., 0.98 μm band) used for thin must be optically coupled with a single-mode optical fiber with a high coupling efficiency. Therefore, with the semiconductor laser of this type, it is necessary to be operated in its stable fundamental mode. At the same time, it is necessary to have an emission spot matched to the light spot of a single-mode optical fiber with direct coupling or indirect coupling by way of a lens system, thereby realizing a desired optical coupling with a single-mode optical fiber at the emission edge of the laser.

With the high-output semiconductor laser of this type, generally, the width of the optical waveguide serving as the resonator is set at approximately 3.5 μm or less to allow the propagation of only the fundamental mode. The width of the waveguide is set constant along the propagation direction of light (i.e., along the longitudinal axis of the resonator) over the whole length. This is because the propagation mode (i.e., the lateral mode, which is parallel to the active layer) of light and its number allowed in an optical waveguide are determined by the width of the waveguide. This point will be explained below with reference to FIG. 1.

FIG. 1 shows the lateral mode change of propagating light dependent on the waveguide width W and the refractive index difference Δn in the optical waveguide of a conventional semiconductor laser of this type. In FIG. 1, the refractive index of the external part of the waveguide is 3.386 and constant over the whole length. The refractive index difference between the inside and outside of the waveguide is Δn. Thus, the refractive index of the waveguide is given as (3.386+Δn).

As seen from FIG. 1, the type and number of the allowable propagation modes (i.e., the lateral mode) of light are determined according to the width W and the refractive index difference Δn. In the example of FIG. 1, if the refractive index difference Δn is constant, only the fundamental mode (m=0) is propagated when the width W is sufficiently small. When the width W is increased slightly, the fundamental mode (m=0) and the first mode (m=1) are propagated. When the width w is further increased, the fundamental mode (m=0), the first mode (m=1), and the second mode (m=2) are propagated. In the same way, as the width W increases, the third mode (m=3), or the third mode and the fourth mode (m=4) will be additionally propagated. Thus, to propagate only the fundamental mode, the width W needs to be adjusted or selected according to the refractive index difference Δn.

With the above-described ordinary high-output semiconductor laser, the width W of the waveguide is constant along its axis and therefore, the following problems will occur.

Specifically, to obtain the stable lateral or horizontal mode, the waveguide needs to be narrowed. On the other hand, to realize a considerably wide spot size of the output light to cope with the high-output operation, it is effective to make the waveguide wide. As a result, if the width of the waveguide is constant, only one of these two requirements is realizable.

Here, the reason why to make the waveguide wide is effective to enlarge the spot size of the output light is explained below with reference to FIG. 2.

FIG. 2 shows the relationship between the waveguide width W and the FWHM (Full Width at Half Maximum) of the lateral or horizontal spot size of the conventional semiconductor laser used for FIG. 1, where $\Delta n=3.5\times10^{-3}$ (=0.0035).

As seen from FIG. 2, the lateral or horizontal spot size of the output light from the waveguide varies dependent on the width W of the waveguide. When the width W is larger than approximately, 1.5 μm, the FWHM of the horizontal spot size increases approximately proportional to the width W. Thus, to obtain a horizontally wide light spot of the output light, it is effective to increase the width w at the output end of the waveguide.

To satisfy the above-described two conflicting requirements (i.e., stabilization of the lateral mode and expansion of the spot size) simultaneously, various improved waveguides whose width is changed along its length have been developed and disclosed so far.

For example, with the semiconductor laser disclosed by the Japanese Non-Examined Patent Publication No. 9-307181 published in 1997, the optical waveguide serving as the resonator of a semiconductor laser is tapered. This laser comprises an active layer for emitting light, semiconductor cladding layers for confining light, a resonator structure for generating laser light, and a stripe-shaped, high refractive index region where the effective refractive index is higher than the other part, which are formed on a semiconductor substrate. The high refractive index region extends along the resonator. The width of the high refractive index region varies exponentially along the resonator. Thee width of the high refractive index region is 3.5 μm or less on one side of the resonator and 5 μm or greater on the other side thereof.

A current narrowing layer is selectively formed at each side of the tapered waveguide. The tapered geometry of the waveguide is realized by the current narrowing layer.

with the prior-art laser disclosed by the above-identified Publication No. 9-307181, the width of the waveguide at the front edge (i.e., the emission edge) where the density of light is high is set wide (at 5 μm or greater) to enlarge the light spot, thereby decreasing the density of light at the emission edge. Thus, degradation of the laser structure due to Catastrophic optical Damage (COD) or Catastrophic Optical Mirror Damage (COMD) is suppressed. On the other hand, the width of the waveguide at the rear edge where the density of light is comparatively low is set narrow (at 3.5 μm or less) to stabilize the lateral mode, thereby suppressing the generation of kink. "Kink" is a main factor that limits the high-output operation. Thus, kink-free output of 200 mW or higher is obtainable. As a result, mode loss due to mode conversion is prevented and the lateral mode is stabilized, which realizes high-level reliability in the high-output semiconductor laser.

In addition, with the prior-art laser disclosed by the Publication No. 9-307181, the width of the high refractive index region may be constant near the edge or edges.

The Japanese Non-Examined Patent Publication No. 8-340147 published in 1996 discloses a semiconductor laser having the same structure as that of the above-identified Publication No. 9-307181. The laser shown in the Publication No. 9-307181 seems to utilize the laser shown by the Publication No. 8-340147.

The Japanese Non-Examined Patent Publication No. 8-23133 published in 1996 discloses a semiconductor laser whose waveguide serving as the resonator has a varying width along its length. This laser has a ridge-type waveguide structure for controlling the lateral mode of propagating light. The active layer is narrowed by selectively removing the active layer or by selectively forming recesses at each side of the ridge-type waveguide, thereby suppressing the radiation mode. Thus, there are the advantages that the laser operates stably at the lateral fundamental mode even when the output level of light is as high as the watt class, the fabrication yield is high, and the reproducibility of characteristics is good.

The Japanese Non-Examined Patent Publication No. 9-289354 published in 1997 discloses a high output, low threshold current semiconductor laser having a large horizontal spot diameter. This laser comprises a semiconductor layered structure formed on the semiconductor substrate. The layered structure includes the active layer which is stripe-shaped along the resonator. The width of the active layer is W1 at the front edge and W2 at the rear edge, where W1>W2. The width varies continuously from W2 to W1 along the resonator. Thus, laser light with a large horizontal spot diameter is generated.

With the prior-art laser disclosed by the above-identified Publication No. 9-289354, the width W1 at the front edge (i.e., the emission edge) is set to be approximately equal to the spot diameter of the light that propagates through an optical fiber to be coupled with the laser. The width W2 at the rear edge is set in such a way that laser oscillation occurs at the single lateral mode.

The Japanese Non-Examined Patent Publication No. 5-267772 published in 1993 discloses a ultra high output, lateral mode-controlled semiconductor laser. This laser, which is designed for a light source for SHG (Secondary Harmonic Generation), has a broad area structure at its edge. A narrow stripe-shaped part is formed in the cavity as the gain-guided waveguide structure.

With the prior-art laser disclosed by the above-identified Publication No. 5-267772, the broad area structure is provided at the emission edge and therefore, the spot size of light at the same edge is enlarged. This means that degradation of the laser at the emission edge does not occur and high output operation is possible. Since the narrow stripe-shaped part is formed in the cavity, higher modes can be removed due to the mode filtering function. Since the narrow stripe-shaped part has the gain-guided waveguide structure the propagating light will expand efficiently along the waveguide at the interface of the broad area region and the narrow stripe region. Thus, the fundamental mode is efficiently selected.

With the above-described prior-art lasers disclosed by the Publication Nos. 9-307181, 8-340147, and 9-289354, a stable lateral mode is obtainable and at the same time, a considerably wide light spot is possible while taking the coupling with an optical fiber into consideration.

With the above-described prior-art laser disclosed by the Publication No. 8-23133, the coupling with an optical fiber is not referred. However, it seems that a stable lateral mode is obtainable and at the same time, a considerably wide light spot is possible while taking the coupling with an optical fiber into consideration.

With the above-described prior-art laser disclosed by the Publication No. 5-267772, a stable lateral mode is obtainable. However, it seems that the laser is difficult to be coupled with an optical fiber, in particular, a single-mode optical fiber. This is because the stripe-shaped part is set wide at the emission edge to prevent the degradation at the same edge.

According to the inventor's examination, the above-described prior-art semiconductor lasers have the following problems.

With all the above-described prior-art lasers, a specific current is supplied in such a way as to be perpendicular to the optical 1 waveguide (i.e., the resonator) on operation. Therefore, even if the width of the fundamental mode section (i.e., the part with a relatively narrow width) of the waveguide is designed in such a way that only the fundamental mode is propagated on oscillation, there will be a problem that the fundamental mode is unable to be kept when the injection current density exceeds a certain level (e.g., $2 \times 10^4 A/cm^2$). The reason of this problem is as follows.

The gain distribution and the refractive index distribution of an optical waveguide are not always constant but are likely to fluctuate with the increasing injection current density. If the injection current density is very high, the gain distribution and the refractive index distribution will deviate distinctly from their predetermined ones. This deviation corresponds to generation of a new gain distribution and a new refractive index distribution. These new distributions thus generated will allow the propagation of higher modes than the fundamental mode. This point is explained, for example, in the book entitled "semiconductor laser (basis and application)", written by Ryoichi Ito and Michiharu Nakamura, published by Baihukan, 1989, pp. 97.

Accordingly, as disclosed in the paper, IEEE Photonics Technology Letters, Vol. 6, No. 12, December 1994, pp. 1409-1411, there arises a possibility that the propagating light, which has been going straight, is bent. This means that the direction of the output light beam may be changed. This phenomenon is termed the "beam steering".

Because of the above-described mechanism, even if the fundamental mode section (i.e., the narrow part) of the optical waveguide is designed for allowing the propagation of only the desired fundamental mode, if the injection current density exceeds a certain level (e.g., $2 \times 10^4 A/cm^2$), a problem that the direction of the output light beam may be changed will occur. This problem decreases the coupling efficiency of the laser with an optical system such as an optical fiber, thereby lowering the utilization efficiency of the output light.

Additionally, the maximum output of a high-output semiconductor laser is limited by "thermal saturation". "Thermal saturation" is caused by the fact that Joule heat generated in a semiconductor laser by the injection current induces saturation of the gain of the laser.

SUMMARY OF THE INVENTION

Accordingly, an object of the present invention is to provide a semiconductor laser that effectively suppresses the generation of "beam steering", and a semiconductor laser module using the laser.

Another object of the present invention is to provide a semiconductor laser that raises the maximum output with a simple configuration, and a semiconductor laser module using the laser.

Still another object of the present invention is to provide a semiconductor laser that prevents the coupling efficiency of the output light with an external optical system from lowering, and a semiconductor laser module using the laser.

The above objects together with others not specifically. mentioned will become clear to those skilled in the art from the following description.

According to a first aspect of the invention, an edge emitting semiconductor laser is provided, which comprises!

an optical waveguide including an active layer and a cladding layer, the waveguide serving as a resonator;

a first edge to which one end of the waveguide is connected, the first edge serving as an emission edge;

a second edge to which the other end of the waveguide is connected, the second edge being located at an opposite side to the first edge;

the waveguide including at least two parts having different widths, one of the at least two parts being a fundamental mode section that allows a fundamental mode to propagate; and current injection suppressing means for suppressing or controlling current injection into the active layer in at least part of the fundamental mode section.

With the edge emitting semiconductor laser according to the first aspect of the invention, the waveguide includes at least two parts having different widths, one of the at least two parts being a fundamental mode section that allows a fundamental mode to propagate. Moreover, the current injection suppressing means is provided for suppressing or controlling current injection into the active layer in at least part of the fundamental mode section. Therefore, compared with the case where the current injection suppressing means is not provided, the current to be injected into the active layer on operation is reduced or it is prevented from being injected. Thus, the effective injection current density in the fundamental mode section is lowered. Accordingly, the "beam steering", which is caused if the injection current density in the fundamental mode section exceeds a certain level, can be suppressed.

Furthermore, since the "beam steering" can be suppressed by simply providing the current injection suppressing means, the maximum output of the laser can be raised with a simple configuration. Additionally, the coupling efficiency of the laser with an external optical system can be prevented from lowering.

In a preferred embodiment of the laser according to the first aspect of the invention, the current injection suppressing means is made by a current blocking layer formed in such a way as to overlap with at least part of the fundamental mode section. In this embodiment, it is preferred that the cladding layer of the waveguide has a depression, into which the current blocking layer is fitted. It is preferred that part of the cladding layer thinned by the depression is a current non-injection region.

In another preferred embodiment of the laser according to the first aspect of the invention, the current injection suppressing means is made by a current-limiting masking layer formed outside the waveguide in such a way as to overlap with at least part of the fundamental mode section. In this embodiment, it is preferred that the current-limiting masking layer is located to be adjacent to at least one electrode of the laser. It is preferred that the current-limiting masking layer is made of a dielectric.

In still another, preferred embodiment of the laser according to the first aspect of the invention, the current injection suppressing means is made by a passive wave-guiding region (i.e., a wave-guiding region with no gain) formed in such a way as to overlap with at least part of the fundamental mode section. In this embodiment, it is sufficient that the passive wave-guiding region has a band gap (i.e., a forbidden band width) greater than an energy corresponding to an oscillation wavelength of the laser. It is preferred that the passive wave-guiding region is formed by ion-implanting a dopant into at least part of the fundamental mode section.

Preferably, the current injection suppressing means is located to be adjacent to the second edge.

In a further preferred embodiment of the laser according to the first aspect of the invention, the current injection suppressing means is located to be adjacent to the second edge and a second current injection suppressing means is provided to be adjacent to the first edge. In this embodiment, there is an additional advantage that the emission edge (i.e., the first edge) is effectively prevented from being damaged.

The other preferred embodiments of the laser according to the first aspect of the invention are as follows:

(i) The fundamental mode section has a width of 3.5 $\mu$m or less. Wider part of the waveguide than the fundamental mode section has a width of 4 $\mu$m or greater and is connected to the first edge at the same width.

(ii) The fundamental mode section is connected to the second edge. A first wider part of the waveguide than the fundamental mode section is connected to the first edge. In this case, preferably, the fundamental mode section is directly connected to the first part. Alternately, the fundamental mode section is connected to the first part by way of a second wider part of the waveguide than the fundamental mode section.

(iii) a first wider part of the waveguide than the fundamental mode section is connected to the first edge and a second wider part of the waveguide than the fundamental mode section is connected to the second edge. Edges of the fundamental mode section are connected to the first wider part and the second wider part, respectively.

(iv) The waveguide is entirely tapered. The fundamental mode section is located on a narrow side of the waveguide. A wider part of the waveguide than the fundamental mode section is located on the narrow side of the waveguide.

(v) A first wider part of the waveguide than the fundamental mode section is a multimode section that allows the fundamental mode and its higher modes. The fundamental mode section is directly connected to the multimode section. Alternately, the fundamental mode section is connected to the multimode section by way of a second wider part of the waveguide than the fundamental mode section.

According to a second aspect of the invention, a semiconductor laser module is provided. The module comprises a semiconductor laser element according to the first aspect of the invention, and a fiber fixing means for fixing an end of an optical fiber in such a way as to be adjacent to the first edge of the laser element.

With the semiconductor laser module according to the second first aspect of the invention, a semiconductor laser according to the first aspect of the invention is provided as the semiconductor laser element and therefore, it is obvious that the same advantages as those of the semiconductor laser according to the first aspect of the invention are obtainable.

In a preferred embodiment of the module according to the second aspect of the invention, the module is designed in such a way that an optical fiber having a coupling lens integrally formed at its end is connectable.

In another preferred embodiment of the module according to the second aspect of the invention, the module is designed in such a way that output light of the laser element is introduced into an optical fiber by way of an external coupling lens. In this embodiment, it is preferred that the optical fiber has a built-in coupling lens at its end.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
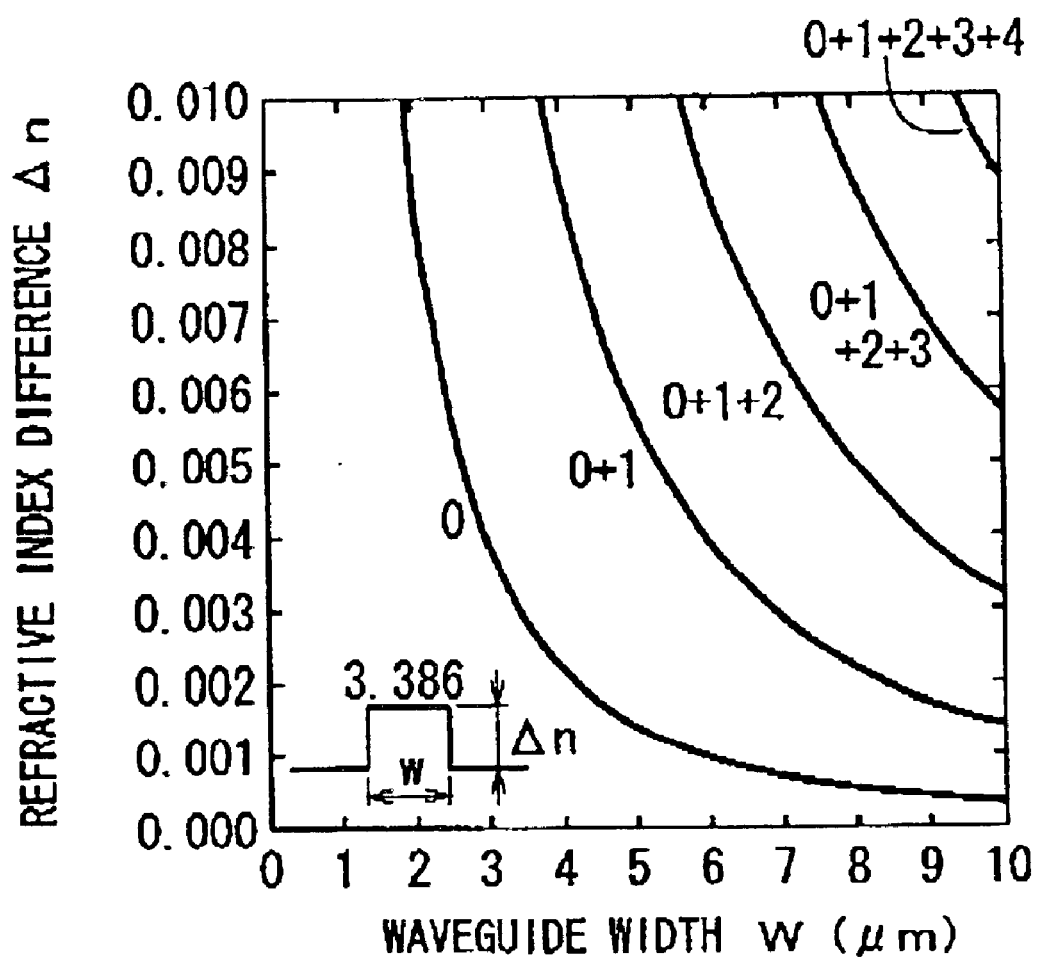
FIG. 1 is a graph showing the lateral mode change of propagating light dependent on the waveguide width W and the refractive index difference Δn in the optical waveguide of a conventional semiconductor laser.
Figure 2:
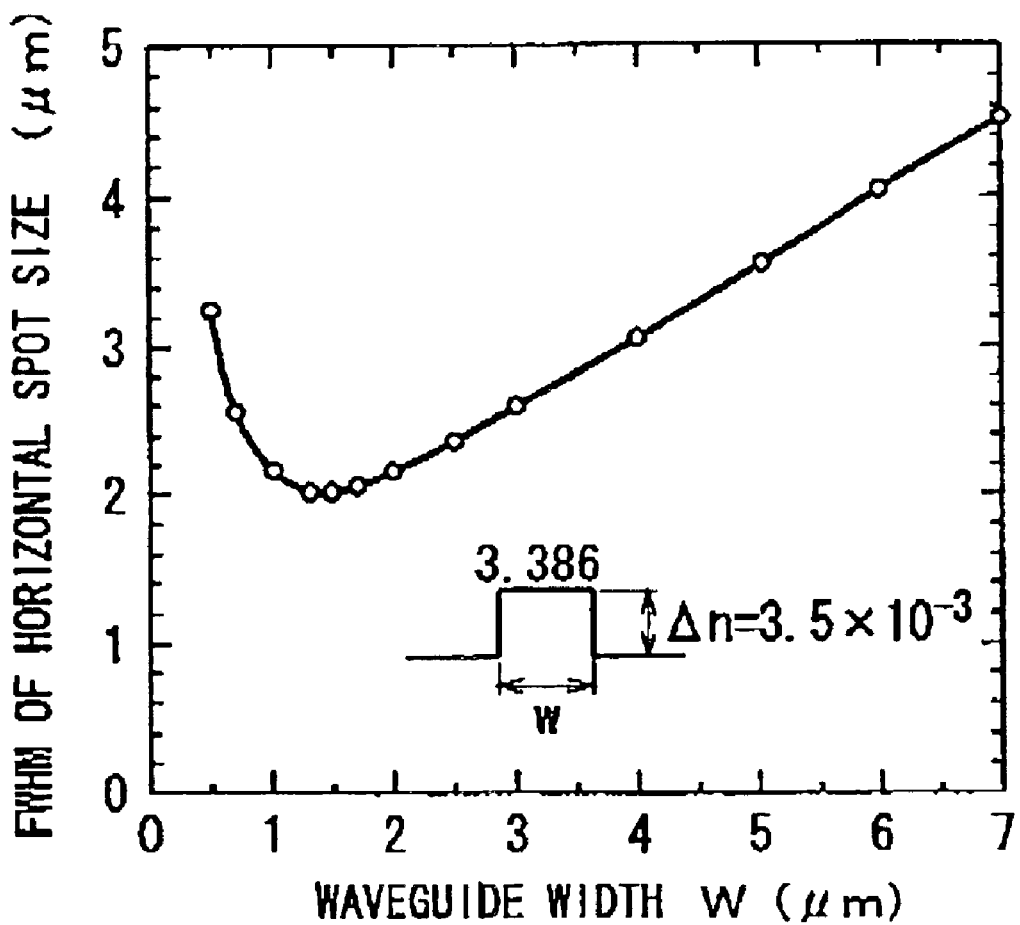
FIG. 2 is a graph showing the relationship between the waveguide width W and the FWHM (Full Width at Half Maximum) of the horizontal or lateral spot size of the conventional semiconductor laser used for FIG. 1.

Preferred embodiments of the present invention will be described in detail below while referring to the drawings attached.

First Embodiment

FIGS. 3 to 6 show the configuration of an edge emitting semiconductor laser (980 nm band) according to a first embodiment of the invention.

This laser comprises a n-type GaAs substrate 1 (thickness: approximately 350 μm) doped with silicon (Si) at the concentration of $1 \times 10^{17}$ cm$^{-3}$. On the substrate 1, a n-type $Al_{0.3}Ga_{0.7}As$ cladding layer 2 (thickness: 2000nm, doping concentration of Si: $1 \times 10^{17}$ cm$^{-3}$) is formed. On the n-type cladding layer 2, a n-type $Al_{0.1}Ga_{0.9}As$ confining layer 3 (thickness: 100 nm, doping concentration of Si: $1 \times 10^{17}$ cm$^{-3}$) is formed. On the n-type confining layer 3, a double quantum well (QW) active layer 4 is formed. The active layer 4 is formed by i-type $In_{0.25}Ga_{0.75}As$ well sublayers (thickness: 5 nm) and i-type GaAs barrier sublayers (thickness: 5 nm) stacked alternately.

On the active layer 4, a p-type $Al_{0.1}Ga_{0.9}As$ confining layer 5 (thickness: 100 nm, doping concentration of magnesium (Mg): $1 \times 10^{18}$ cm$^{-3}$) is formed. On the p-type confining layer 5, a p-type $Al_{0.3}Ga_{0.7}As$ first cladding layer 6 (thickness: 200 nm, doping concentration of Mg: $1 \times 10^{18}$ cm$^{-3}$) is formed. On the p-type first cladding layer 6, a p-type $Al_{0.45}Ga_{0.55}As$ etch stop layer 7 (thickness: 50 nm, doping concentration of Mg: $1 \times 10^{18}$ cm$^{-3}$) is formed.

The n-type cladding layer 2, the n-type confining layer 3, the i-type active layer 4, the p-type confining layer 5, the p-type first cladding layer 6, and the p-type etch stop layer 7 are formed to cover the whole surface of the substrate 1.

On the p-type etch stop layer 7, a p-type $Al_{0.3}Ga_{0.7}As$ second cladding layer 8 (thickness: 1500 nm, doping concentration of Mg: $1 \times 10^{18}$ cm$^{-3}$) is formed. On the p-type second cladding layer 8, a p-type GaAs cap layer 9 (thickness: 500 nm, doping concentration of Mg: $1 \times 10^{18}$ cm$^{-3}$) is formed. These two layers 8 and 9 constitute a mesa-type ridge structure 20 and do not cover the whole surface of the substrate 1, as show in FIG. 3. These layers 8 and 9 (i.e., the ridge structure 20) are located in the middle of the substrate 1. In other words, the ridge structure 20 is approximately extended on the longitudinal axis of the laser. The surface of the etch stop layer 7 is exposed on each side of the structure 20. An optical waveguide 40, which serves as the optical resonator of the laser, is formed along the structure 20.

The spaces existing over the etch stop layer 7 at each side of the ridge structure 20 are filled with a n-type AlGaAs current blocking layer 10 (thickness: 1000 nm, doping concentration of Si: $1 \times 10^{17}$ cm$^{-3}$) and a n-type GaAs current blocking layer 11 (thickness: 500 nm, doping concentration of Si: $1 \times 10^{17}$ cm$^{-3}$) formed on the layer 10. The top of the lower current blocking layer 10 is in approximately the same plane as that of the p-type cap layer 9 in the structure 20. In other words, the height of the layer 10 is approximately the same as the structure 20. Therefore, the upper current blocking layer 11 is slightly higher than the structure 20 and at the same time, the top of the cap layer 9 is exposed from the central opening of the upper current blocking layer 11.

Figure 3:
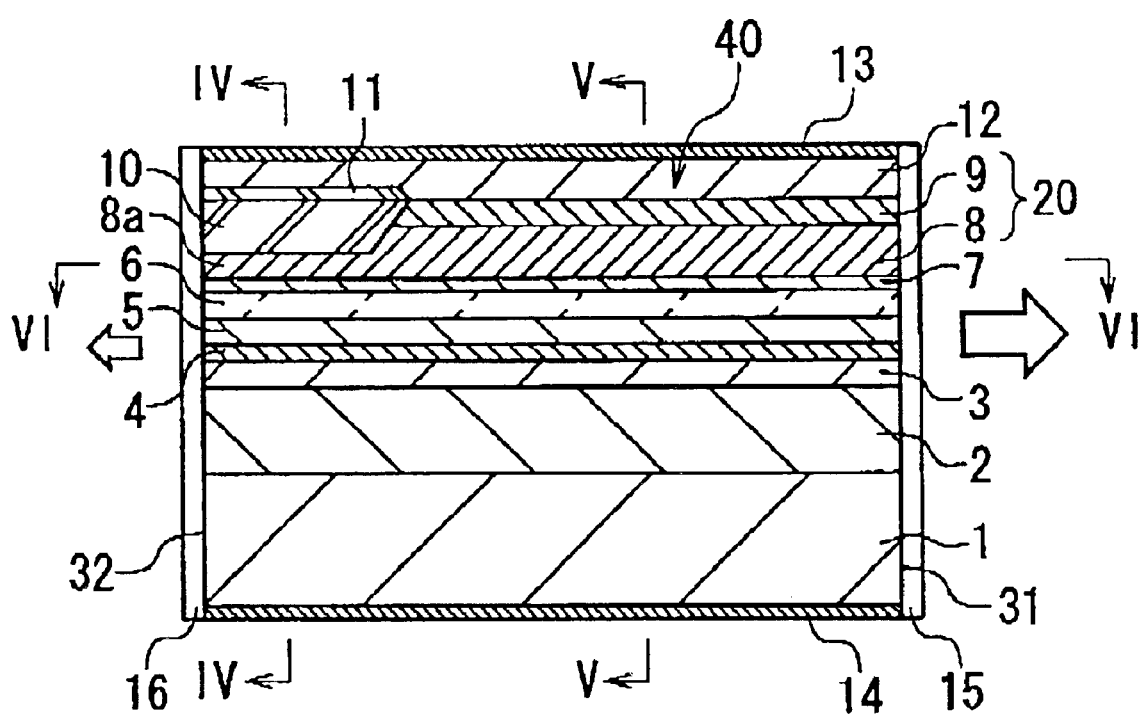
FIG. 3 is a longitudinal, vertical, cross-sectional view showing the configuration of a semiconductor laser according to a first embodiment of the invention.
Figure 4:
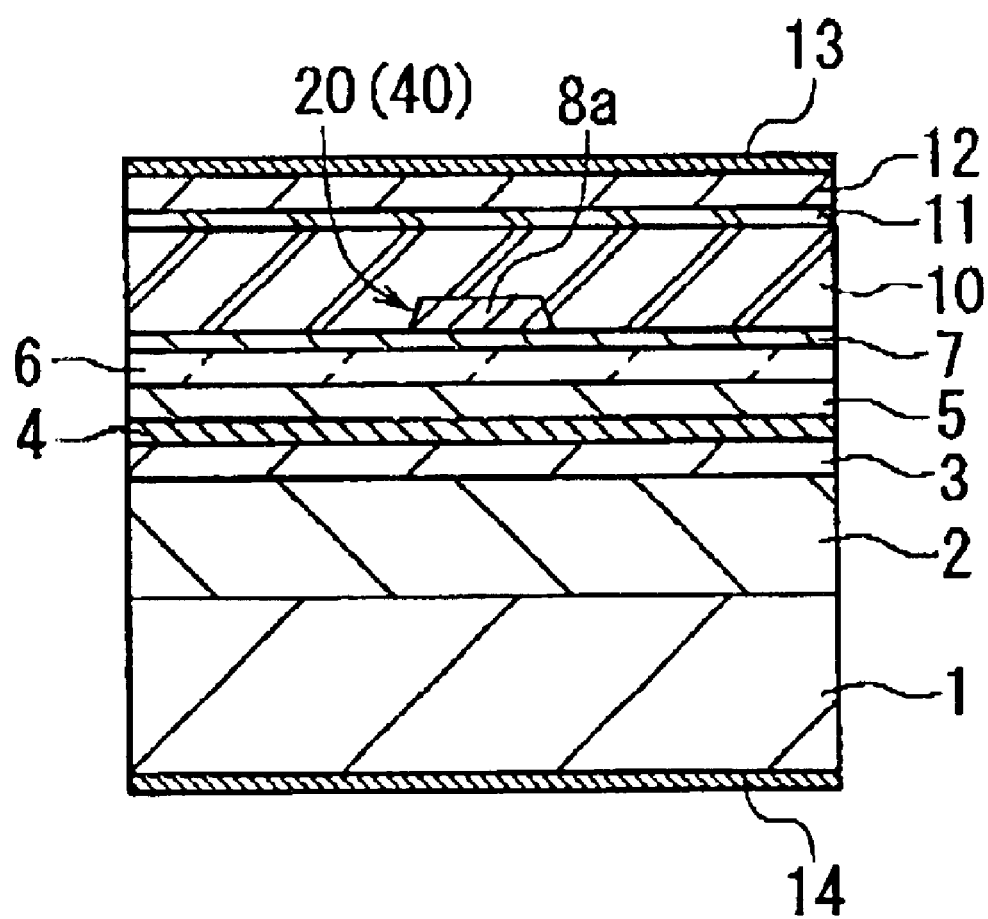
FIG. 4 is a vertical, cross-sectional view along the line IV—IV in FIG. 3, which shows the configuration of the laser according to the first embodiment of FIG. 3.

As clearly shown in FIG. 3, the p-type second cladding layer 8 is partially removed at its end near the rear edge 32 of the layered structure, thereby forming a depression. Because of this depression, the thickness of this part of the layer 8 is decreased. The n-type current blocking layer 10 is partially fitted into the depression. As a result, the plan shape of the layer 10 (and the n-type current blocking layer 11) is like the U character, as seen from FIG. 6. The thinned part 8a of the layer 8 is to prevent the injection current by the two current blocking layers 10 and 11 when the laser is operated. The thinned part 8a is termed the "current non-injection region" of the layer 8.

On the n-type GaAs current blocking layer 11 and the p-type GaAs cap layer 9 exposed from the opening of the layer 11, a p-type GaAs contact layer 12 (thickness; 500 nm, doping concentration of Mg: $2 \times 10^{18}$ cm$^{-3}$) is formed. On the contact layer 12, a p-side electrode 13 made of TiPtAu is formed. Each of the contact layer 12 and the electrode 13 covers the whole surface of the substrate 1.

On the back (lower surface) of the n-type GaAs substrate 1, a n-side electrode 14 made of AuGeNi is formed. The electrode 14 covers the whole back of the substrate 1.

The front and rear edges 31 and 32 of the laser, which are located at opposite ends of the layered structure, are perpendicular to the optical waveguide 40. The waveguide 40 is formed by the ridge structure 20 including the p-type $Al_{0.3}Ga_{0.7}As$ second cladding layer 8 and the p-type GaAs cap layer 9. The front edge 31 is entirely covered with an anti-reflection (AR) film 15. The rear edge 32 is entirely covered with a high reflectance (HR) film 16. The AR film 15 is typically formed by a single dielectric film or the combination of stacked dielectric films. The HR film 16 is typically formed by the combination of stacked dielectric films.

The semiconductor ridge structure 20 constituting the waveguide 40 extends from the front edge 31 to the rear edge 32 along the substrate 1. The output light of the laser is emitted from the front edge 31, as indicated by the arrow in FIG. 3. Therefore, the front edge 31 is the "emission edge" of the output light.

Figure 6:
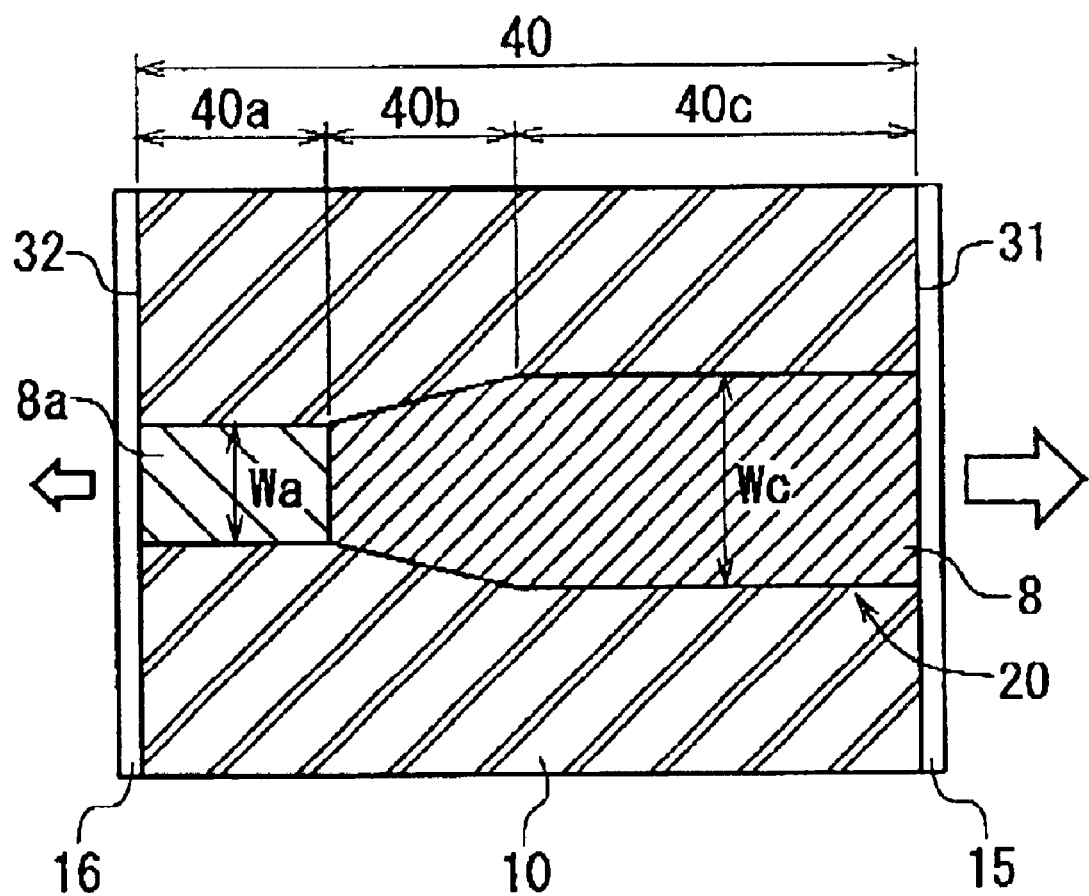
FIG. 6 is a horizontal, cross-sectional view along the line VI—VI in FIG. 3, which shows the configuration of the laser according to the first embodiment of FIG. 3.

The waveguide 40 extending along the ridge structure 20 has a symmetrical plan shape with respect to its longitudinal axis, as clearly shown in FIG. 6. The waveguide 40 comprises a straight part 40a with a relatively small width Wa, a straight part 40c with a relatively large width Wc, and a tapered part 40b connecting the straight parts 40a and 40c to each other. The outer end (the left end in FIG. 6) of the narrower straight part 40a is connected to the rear edge 32 or the laser. The outer end (the right end in FIG. 6) of the wider straight part 40c is connected to the front edge (i.e., the emission edge) 31 of the laser.

The relatively wide straight part 40c constitutes a "multimode section" of the waveguide 40 that allows the propagation of not only the fundamental mode (m=0) but also its higher modes (m=1, 2, . . . ) by setting the width Wc at a certain value, for example, 5 μm or greater. Generally, even if an optical waveguide is wide, only the fundamental mode can be propagated through the waveguide if the refractive index difference between the inside of the waveguide and the outside thereof is set at a sufficiently small value. Therefore, by doing so, the straight part 40c can be designed as a "fundamental mode section" that allows the propagation of only the fundamental mode. (This is applicable to all the embodiments of the invention explained herein.) This means that the part 40c may constitute a "fundamental mode section" or a "multimode section". On the other hand, the relatively narrow straight part 40a constitutes a "fundamental mode section" by setting the width Wa at a certain value, for example, 3.5 μm or less (in other words, by giving a mode filtering function). The tapered part 40b has a function of optically coupling the straight parts 40a and 40c with each other. As a result, only the fundamental mode is excited in the laser oscillator formed by the straight parts 40a and 40c and the tapered part 40b.

Figure 5:
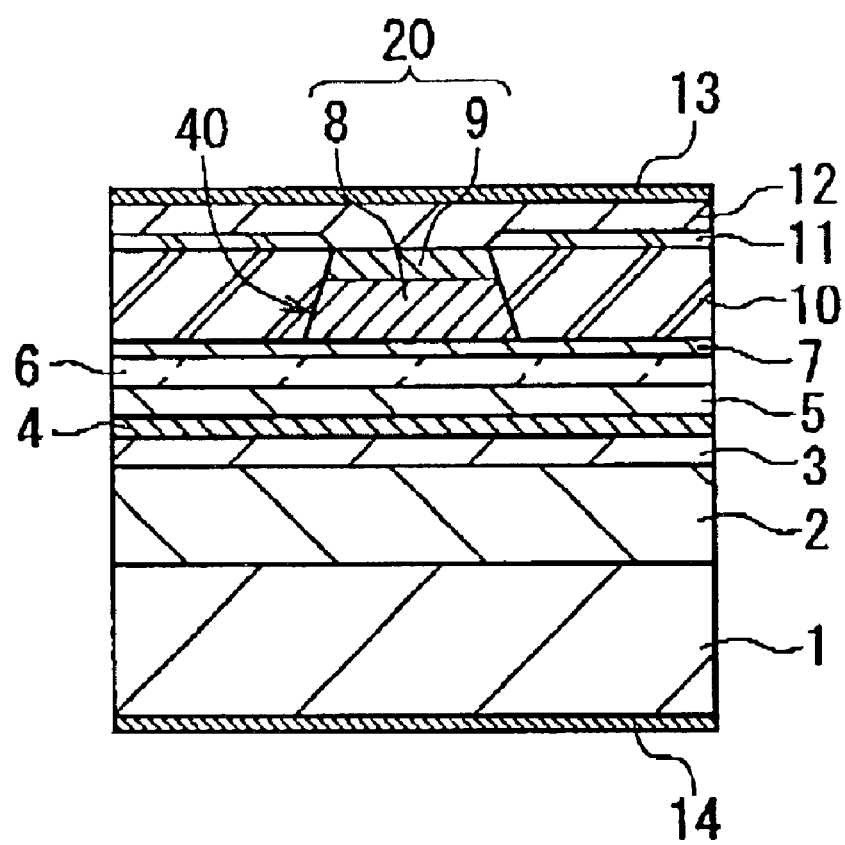
FIG. 5 is a vertical, cross-sectional view along the line V—V in FIG. 3, which shows the configuration of the laser according to the first embodiment of FIG. 3.

As clearly shown in FIG. 5, the ridge structure 20 is actually mesa-shaped (i.e., the cross section is trapezoidal) and therefore, all the widths Wa, Wb, and Wc of the parts 40a, 40b, and 40c of the waveguide 40 gradually decrease from their bottoms to their tops. Thus, in this specification, the widths Wa, Wb, and Wc are defined as their maximum values at their bottoms, respectively.

The width of the waveguide 40 is determined or given by the width of a region having a high effective refractive index that contributes the optical wave-guiding function. Thus, the width of the waveguide 40 is not always equal to the width of the ridge structure 20.

Next, a method of fabricating the above-described semiconductor laser according to the first embodiment is explained below with reference to FIGS. 7A and 7B to 10A and 10B.

Figure 7A:
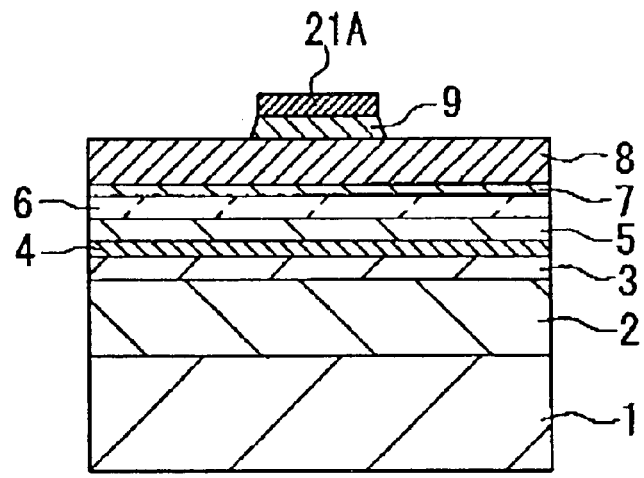
FIGS. 7A and 7B are a vertical, cross-sectional view along the line IV—IV in FIG. 3 and a plan view, respectively, which show a method of fabricating the laser according to the first embodiment of FIG. 3.
Figure 7B:
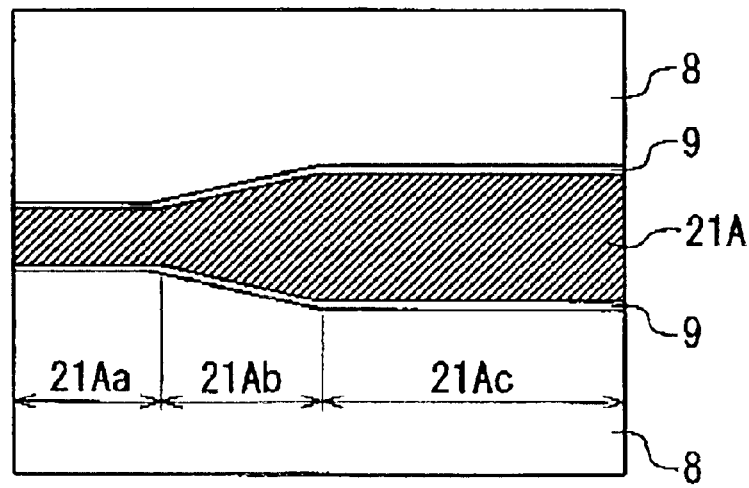

First, the n-type GaAs substrate 1 is prepared. Then, as shown in FIGS. 7A and 7B, the n-type $Al_{0.3}Ga_{0.7}As$ cladding layer 2, the n-type $Al_{0.1}Ga_{0.9}As$ confining layer 3, the i-type double QW active layer 4, the p-type $Al_{0.1}Ga_{0.9}As$ confining layer 5, the p-type $Al_{0.3}Ga_{0.7}As$ first cladding layer 6, the p-type $Al_{0.45}Ga_{0.55}As$ etch stop layer 7, the p-type $Al_{0.3}Ga_{0.7}As$ second cladding layer 8, and the p-type GaAs cap layer 9 are successively formed on the substrate 1 in this order by using an appropriate crystal growth method or methods. For example, a Metal-Organic Chemical Vapor Deposition (MOCVD), a Molecular Beam Epitaxy (MBE), or the like may be used for this purpose.

Subsequently, a dielectric layer (e.g., a $SiO_2$ layer) (not shown) is formed on the p-type cap layer 9 and then, it is selectively etched by the known photolithography and etching techniques, thereby patterning the dielectric layer, as shown in FIGS. 7A and 7B. Thus, a dielectric mask 21A is formed on the cap layer 9. This mask 21A is used to etch only the underlying layer 9. The pattern (i.e., the plan shape) of the mask 21A is approximately in accordance with the plan shapes of the optical waveguide 40 and the ridge structure 20.

The dielectric mask 21A thus formed comprises a stripe-shaped light blocking region 21Aa with a constant width, a tapered light blocking region 21Ab with a varying width, and a stripe-shaped light blocking region 21Ac with a constant width. For example, the width and length of the region 21Aa are 3.5 μm and 400 μm, respectively. The width and length of the region 21Ab are from 3.5 μm to 5 μm, and 200 μm, respectively. The width and length of the region 21Ac are 5 μm and 200 μm, respectively.

In the actual processes, many semiconductor lasers are simultaneously formed on the same substrate 1. Therefore, actually, the pattern comprising the regions 21Aa, 21Ab, and 21Ac is repeated at desired times, thereby arranging the patterns at equal intervals over the whole substrate 1.

Using the dielectric mask 21Aa, the p-type cap layer 9 is selectively etched to expose the p-type second cladding layer r8. The state at this stage is shown in FIGS. 7A and 7B.

Figure 8A:
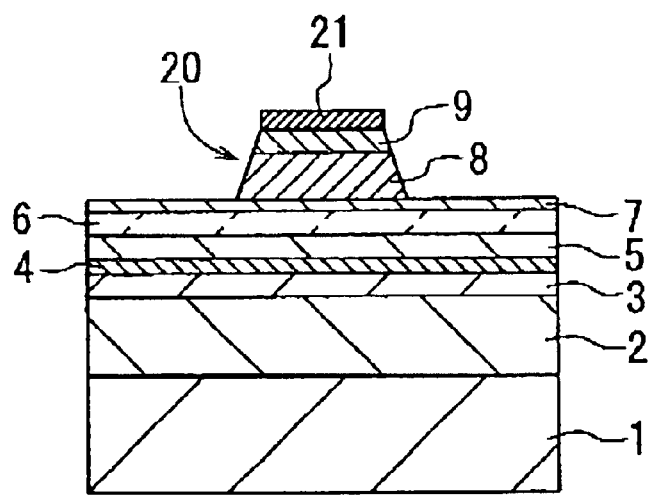
FIGS. 8A, 8B, and 8C are a vertical, cross-sectional view along the line IV—IV in FIG. 3, a plan view, and a longitudinal, vertical cross-sectional view along the resonator, respectively, which show the method of fabricating the laser according to the first embodiment of FIG. 3.
Figure 8B:
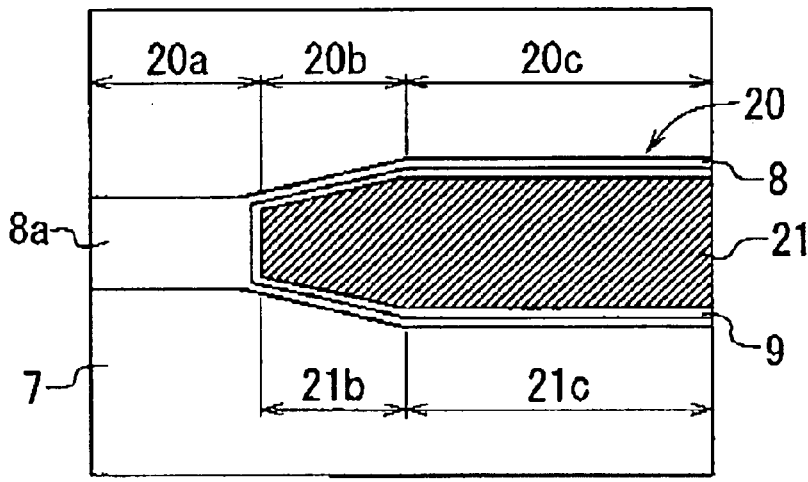
Figure 8C:
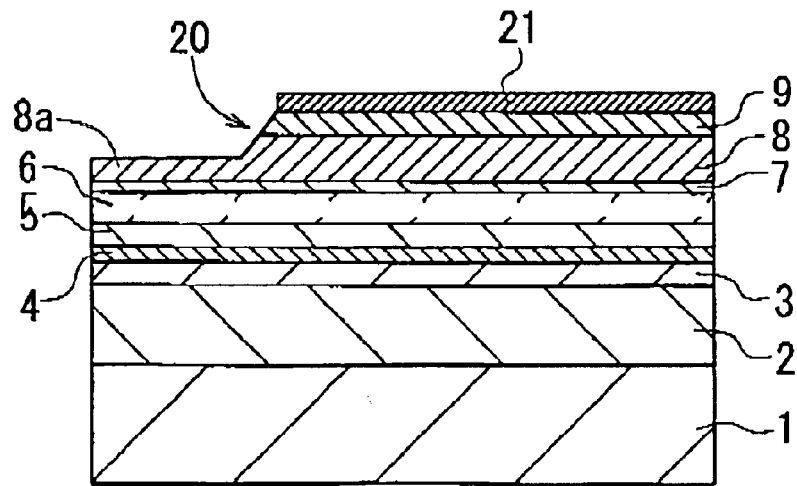

Next, the mask 21A itself is partially etched in such a way that the relatively narrow, stripe-shaped blocking region 21Aa (in other words, the part to be the current non-injection region 8a of the waveguide 40, i.e., to be the fundamental mode section thereof) is selectively removed. Thus, a dielectric mask 21 as shown in FIGS. 8A, 8B, and 8C is formed from the mask 21Aa. The mask 21 thus formed is to selectively expose the cap layer 9 at the location corresponding to the blocking region 21Aa. The mask 21 comprises a tapered light blocking region 21b with a varying width, and a stripe-shaped light blocking region 21c with a constant width.

Using the dielectric mask 21, the stripe-shaped part of the p-type cap layer 9 left on the part corresponding to the stripe-shaped region 21Aa of the mask 21A, and the p-type second cladding layer 8 (which has not been etched so far) are selectively etched. Thus, the ridge structure 20 is formed, as shown in FIGS. 8A to 8C. Since the etch stop layer 7 is formed on the p-type first cladding layer 6, the etching action is not applied to the layer 6 during this process. As a result, only the second cladding layer 8 and the cap layer 9 are selectively etched, resulting in tho ridge structure 20 shown in FIGS. 8A to 8C.

The ridge structure 20 thus formed comprises a stripe-shaped region 20a, a tapered region 20b, and a stripe-shaped region 20c. The tapered region 20b and the stripe-shaped region 20c reflect the shape of the mask 21. The stripe-shaped region 20a reflects the shape of the stripe-like part of the cap layer 9.

In the state of FIGS. 8A to 8C, the second cladding layer 8 with a certain thickness (e.g., approximately 200 nm) is left on the location corresponding to the removed part of the cap layer 9. Thus, the remaining part of the layer 8 constitutes the current non-injection region 8a. Since this region 8a is continuous with the cladding layer 8 existing in the ridge structure 20, the part of the waveguide 40 formed by the region 8a and the remaining part of the waveguide 40 formed by the cladding layer 8 in the structure 20 are optically coupled with each other with practically no loss.

Optical loss is unavoidable in the part of the waveguide 40 formed by the current non-injection region 8a (i.e., the part to be the fundamental mode section). Therefore, the region 8a may be shorter than the fundamental mode section, in which part of the fundamental mode section constitutes the region 8a.

Figure 9A:
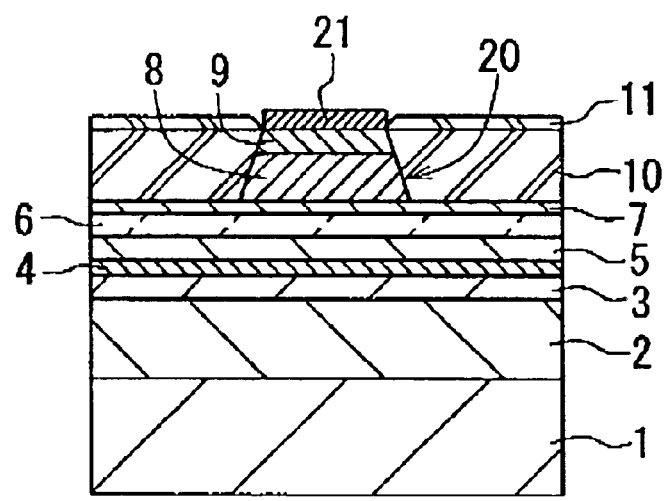
FIGS. 9A and 9B are a vertical, cross-sectional view along the line IV—IV in FIG. 3 and a plan view, respectively, which show the method of fabricating the laser according to the first embodiment of FIG. 3.
Figure 9B:
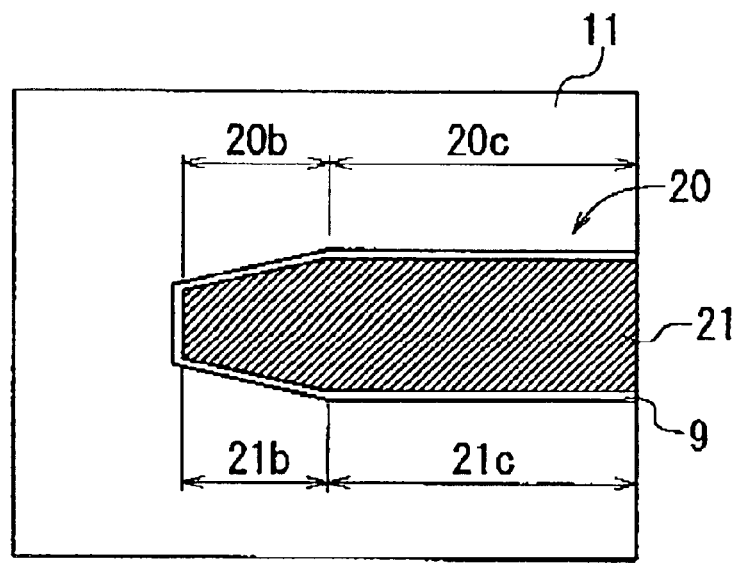

Thereafter, while leaving the mask 21 on the ridge structure 20, the n-type AlGaAs current blocking layer 10 and the n-type GaAs current blocking layer 11 are selectively grown on the etch stop layer 7 in this order by a MOCVD or MBE method, or the like. Thus, as shown in FIGS. 9A and 9B, the spaces existing on the etch stop layer 7 and the current non-injection region 8a are filled with the current blocking layers 10 and 11. Here, the top face of the lower current blocking layer 10 is adjusted in such a way as to have approximately the same height as the remaining second cladding layer 8. As a result, the upper current blocking layer 11 is located above the layer 8.

Figure 10A:
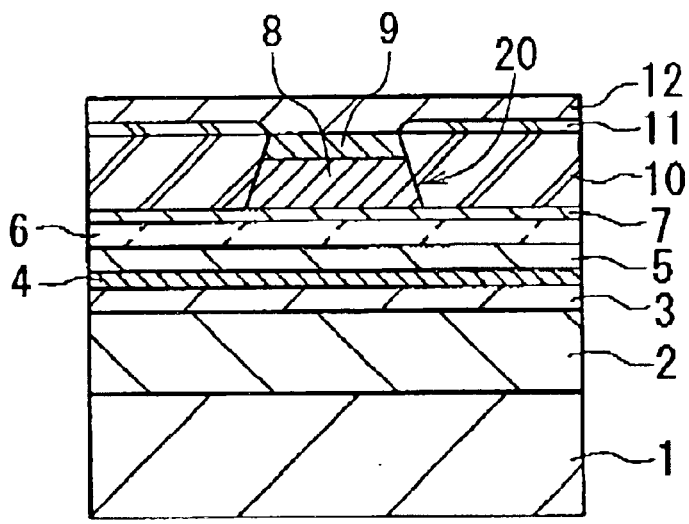
FIGS. 10A and 10B are a vertical, cross-sectional view along the line IV—IV in FIG. 3 and a plan view, respectively, which show the method of fabricating the laser according to the first embodiment of FIG. 3.
Figure 10B:
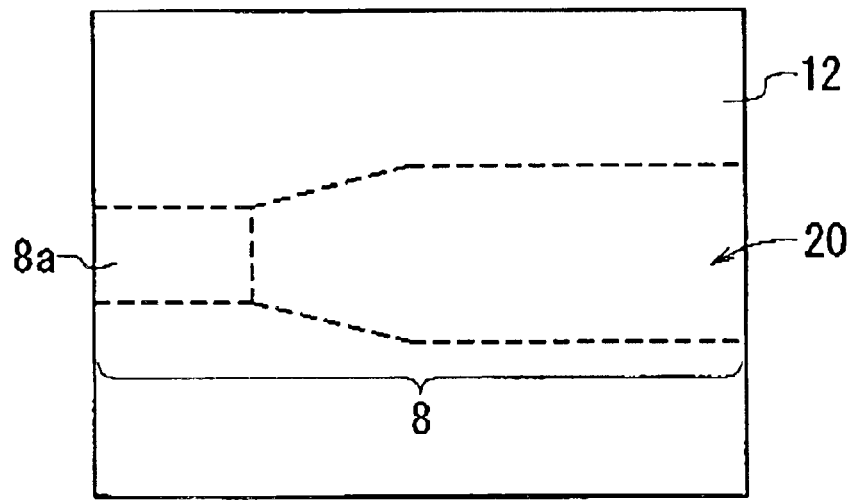

Next, after removing the dielectric mask 21, the p-type GaAs contact layer 12 is grown on the current blocking layer 11 and the cap layer 9 exposed from the opening of the layer 11, resulting in the structure shown in FIGS. 10A and 10B. In this stage, the contact layer 12 is formed to cover not only the current blocking layer 11 but also the cap layer 9. The contact layer 12 covers the whole surface of the substrate 1.

Subsequently, the p-side electrode 13 made of TiPtAu is formed on the contact layer 12 in such a way as to cover the whole surface of the substrate 1.

The back of the substrate 1 is then polished to thin it to a certain thickness (e.g., approximately 100 $\mu$m) and then, the n-side electrode 14 made of AuGeNi is formed on the polished back of the substrate 1. The electrode 14 is formed to cover the whole back of the substrate 1.

Thereafter, the layered structure thus formed on the substrate 1 is cloven along the direction perpendicular to the waveguides 40, resulting in stripe-shaped parts of the structure. In each of the parts thus formed, which includes the same laser structures aligned, the AR film 15 is coated on the front edge 31 perpendicular to the waveguide 40 and the HR film 16 is coated on the rear edge 32 perpendicular to the waveguide 40.

Finally, the aligned laser structures on the cleaved substrate 1 are cut along their central lines between the adjacent ridge structures 20 (i.e., the adjacent waveguides 40) to be separated from each other. In this way, the semiconductor laser according to the first embodiment having the configuration of FIG. 3 is completed.

In the actual fabrication processes, the width of the waveguide 40 is decreased by approximately 0.5 $\mu$m with respect to the width of the mask 21A or 21 due to the etching action. Therefore, the width Wa of the relatively narrow straight part 40a of the waveguide 40 will be 3.0 $\mu$m, the width wc of the relatively wide straight part 40c thereof will be 4.5 $\mu$m, and the width Wb of the tapered part 40b thereof will be from 3.0 $\mu$m to 4.5 $\mu$m.

With the edge emitting semiconductor laser according to the first embodiment, as explained above, the optical waveguide 40 includes the straight part 40a having the relatively small width Wa, the straight part 40c having the relatively wide width Wc, and the tapered part 40b interconnecting these parts 40a and 40c. The relatively narrow straight part 40a serves as the "fundamental mode section". The relatively wide straight part 40c serves as the "multi-mode section" (or the "fundamental mode section").

Moreover, in the relatively narrow straight part 40a (i.e., the "fundamental mode section"), the current non-injection region 8a is provided in the second cladding layer 8 over the whole length of the part 40a for suppressing or controlling the current injection into the active layer 4. Therefore, the current cannot be injected into the inside of the waveguide 40 (i.e., into the active layer 4) by way of the region 8a on operation. Thus, the effective injection current density in the fundamental mode section 40a of the waveguide 40 is lowered. Accordingly, the "beam steering", which is caused if the injection current density in the fundamental mode section 40a exceeds a certain level, can be suppressed.

Furthermore, since the "beam steering" can be suppressed by simply providing the current non-injection region 8a in the second cladding layer 8, the maximum output of the laser can be raised with a simple configuration. Moreover, the coupling efficiency of the laser with an external optical system (e.g., an optical fiber) can be prevented from lowering.

Figure 34:
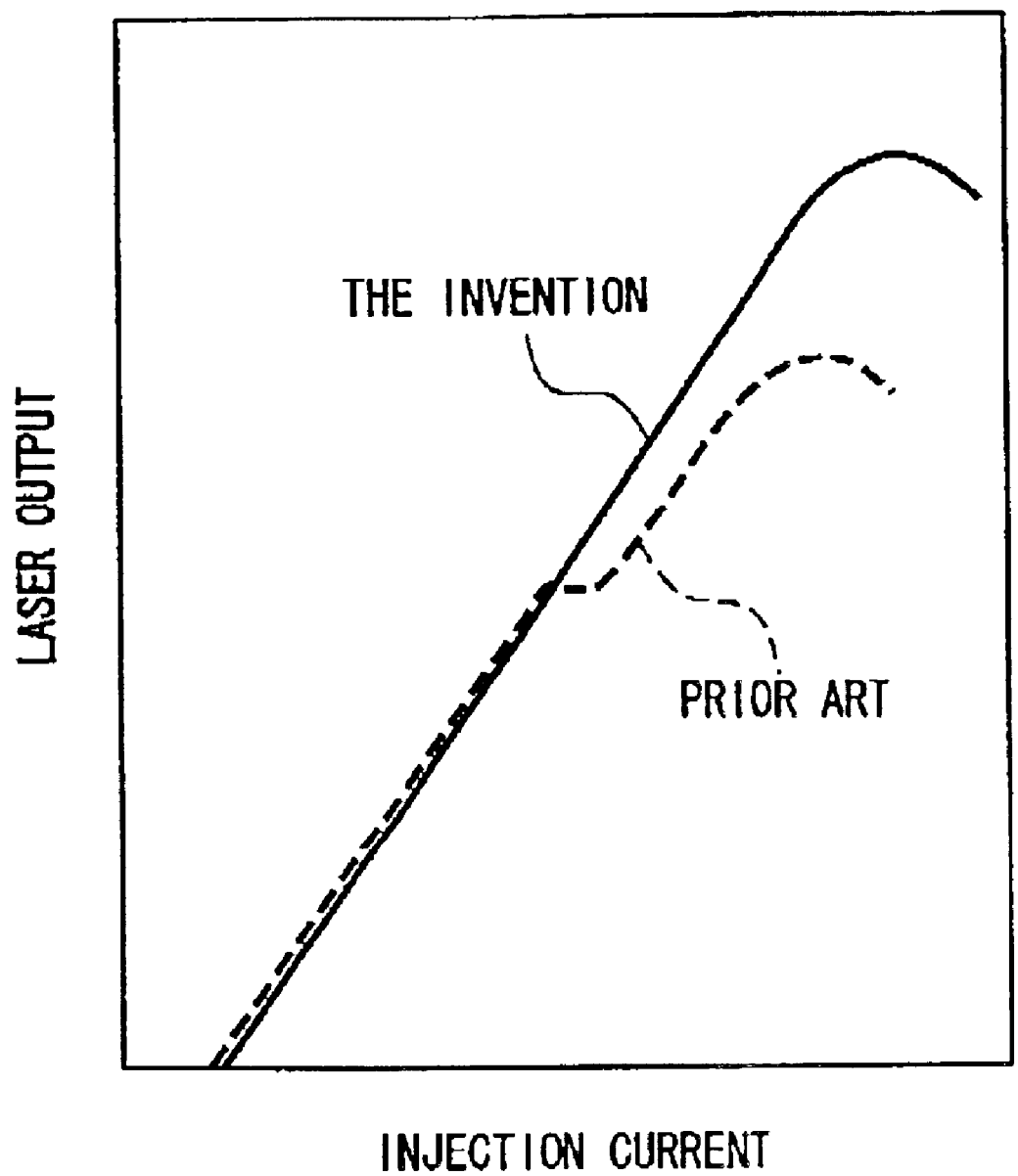
FIG. 34 is a graph showing the relationship between the injection current and the light output of the semiconductor laser according to the first embodiment of the invention and a conventional semiconductor laser.

FIG. 34 shows the advantage of the semiconductor laser of the first embodiment. As seen from the curves in FIG. 34, the kink-free light output of the laser of the first embodiment (which is indicated by the solid line curve) is raised compared with the prior-art laser (which is indicated by the broken line curve). Thus, no kink appears in the curve of the first embodiment in, FIG. 34. This means that the beam steering can be prevented over the whole output range. Accordingly, higher light output is obtainable by increasing the injection current in the laser of the invention.

Since the relatively wide straight part 40c of the waveguide 40 is connected to the emission edge (i.e., the front edge) 31 of the laser, an extremely high optical coupling efficiency is obtainable with respect to an optical fiber with a built-in lens (e.g., a wedge-shaped optical fiber or an optical fiber with a built-in cylindrical lens). An optical fiber with a built-in lens makes it possible to couple the laser output light with an elliptic intensity distribution with the circular core of the fiber with a high coupling efficiency. Examples of the optical fiber with a built-in lens are disclosed in the Japanese Non-Examined Patent Publication No. 8-86923 published in 1996.

Figure 36A:
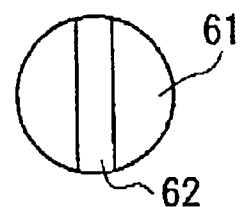
FIGS. 36A to 36C are top, front, and side views of a wedge-shaped optical fiber, respectively, which is used for the laser according to the invention.
Figure 36B:
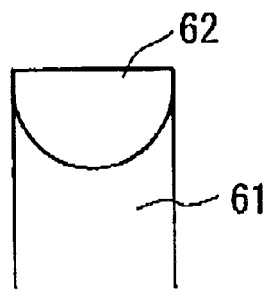
Figure 36C:
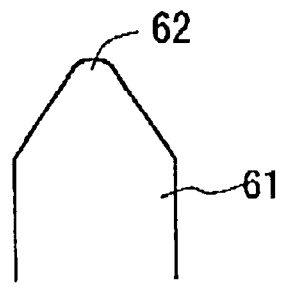
Figure 37A:
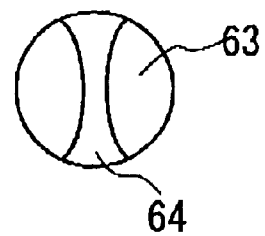
FIGS. 37A to 37C are top, front, and side views of another wedge-shaped optical fiber, respectively, which is used for the laser according to the invention.
Figure 37B:
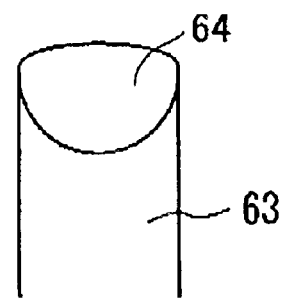
Figure 37C:
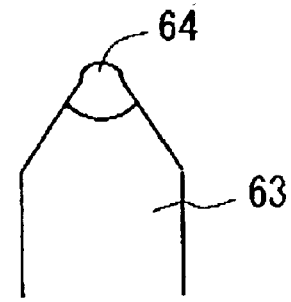

An example of the wedge-shaped optical fiber is shown in FIGS. 36A to 36C. The wedge-shaped optical fiber 61 shown in FIGS. 36A to 36C has a specific curvature at its edge, thereby forming a cylindrical lens 62 at its end. Another example of the wedge-shaped optical fiber is shown in FIGS. 37A to 37C. The wedge-shaped optical fiber 63 shown in FIGS. 37A to 37C has a specific curvature at its edge, thereby forming an elliptic lens 64 at its end. These examples are disclosed in the Publication No. 8-86923.

If the width Wc of the relatively wide straight part 40c of the waveguide 40 is near 4.5 $\mu$m, it is preferred that an optical fiber CS980 fabricated by Corning is used. This is because the optical fiber CS980 has a mode field diameter of approximately 4.2 $\mu$m and thus, the laser of the first embodiment can be well coupled with this fiber. If an appropriate lens processing is applied to, the end of the fiber CS980 in such a way as to be perpendicular to its axis to form a desired lens, an extremely high coupling efficiency is obtainable between the laser of the first embodiment and the CS980 fiber.

The wavefront of light propagating through the waveguide 40 is flat in the relatively narrow straight part 40a (i.e., the fundamental section) and it is turned to be spherical in the tapered part 40b. In the relatively wide straight part 40c (i.e., the multimode or fundamental mode section), the wavefront of light returns flat. Thus, the wavefront of the output light is flat and parallel to the emission edge 31. As a result, there is an additional advantage that the coupling loss between the laser of the first embodiment and an optical fiber to be coupled is suppressed or decreased because of the existence of the part 40c.

Second Embodiment

FIGS. 11 to 15 show the configuration of an edge emitting semiconductor laser (980 nm band) according to a second embodiment of the invention. This laser has the same configuration as the semiconductor laser of the first embodiment, except that two current non-injection regions 8a and 8b are formed in the second cladding layer 8.

Therefore, the explanation about the same configuration is omitted here for the sake of simplification by attaching the same reference symbols as used in the first embodiment to the respective elements in FIGS. 11 to 15.

The laser of the second embodiment has approximately the same layered structure as that of the first embodiment. Specifically, the n-type $Al_{0.3}Ga_{0.7}As$ cladding layer 2 the n-type $Al_{0.1}Ga_{0.9}As$ confining layer 3, the double QW active layer 4, the p-type $Al_{0.1}Ga_{0.9}As$ confining layer 5, the p-type $Al_{0.3}Ga_{0.7}As$ first cladding layer 6, and the p-type $Al_{0.45}Ga_{0.55}As$ etch stop layer 7 are successively formed on the n-type GaAs substrate 1 in this order.

On the p-type etch stop layer 7, the p-type $Al_{0.3}Ga_{0.7}As$ second cladding layer 8 and the p-type GaAs cap layer 9 are formed to be stacked in this order. These two layers 8 and 9 constitute the mesa-type ridge structure 20. The optical waveguide 40, which serves as the optical resonator of the laser, is formed along the structure 20.

The spaces existing over the etch stop layer 7 at each side of the ridge structure 20 are filled with the n-type AlGaAs current blocking layer 10 and the n-type GaAs current blocking layer 11 formed on the layer 10. The top of the cap layer 9 is exposed from the central opening of the current blocking layer 11.

Figure 11:
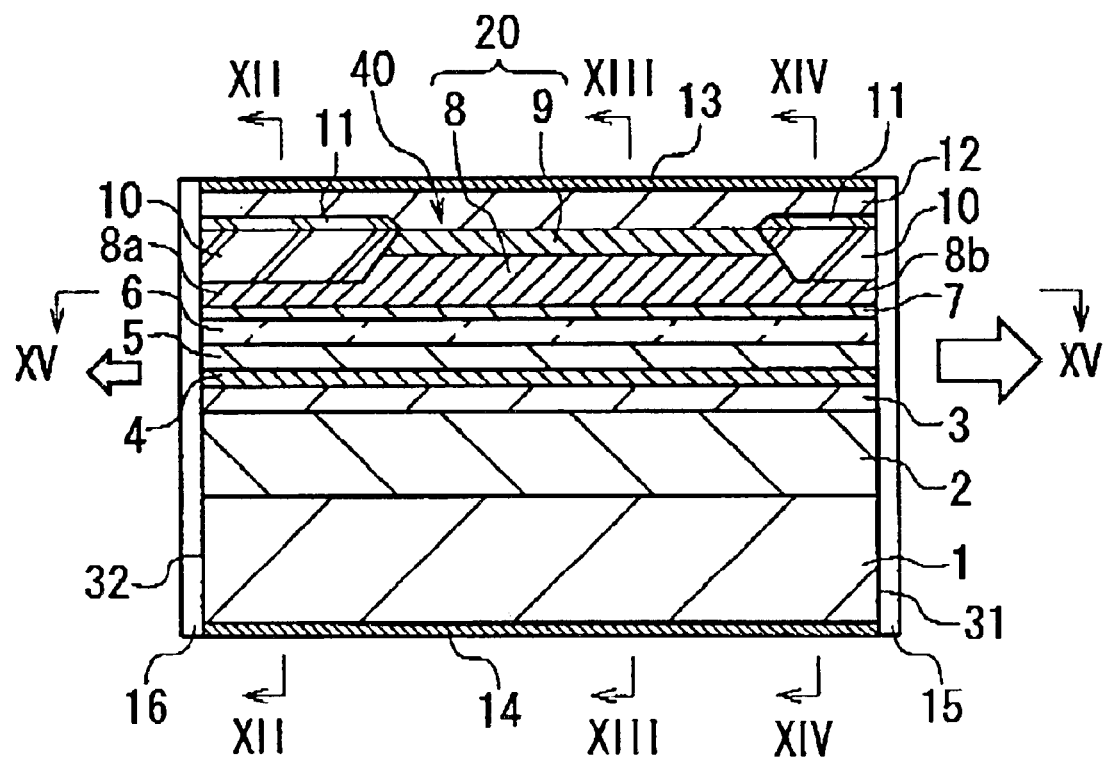
FIG. 11 is a longitudinal, vertical, cross-sectional view showing the configuration of a semiconductor laser according to a second embodiment of the invention.
Figure 12:
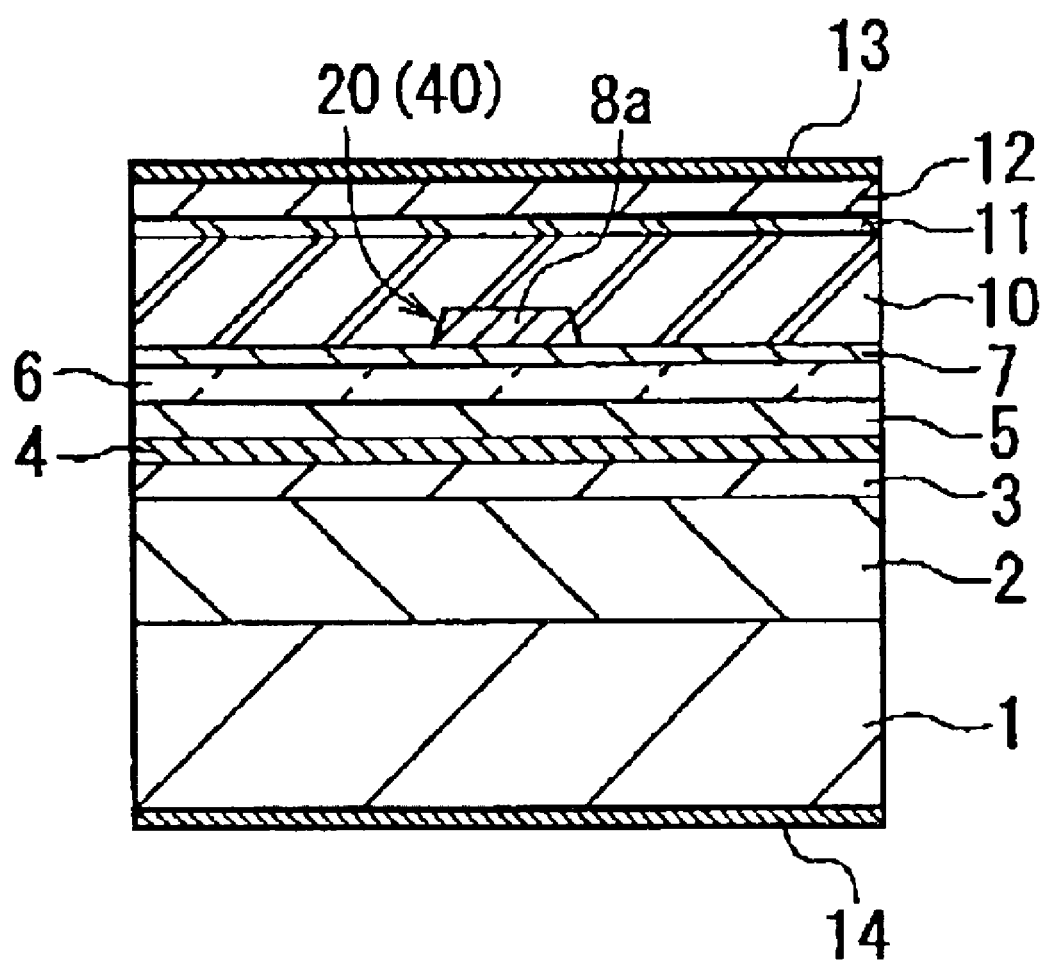
FIG. 12 is a vertical, cross-sectional view along the line XII—XII in FIG. 11, which shows the configuration of the laser according to the second embodiment of FIG. 11.
Figure 13:
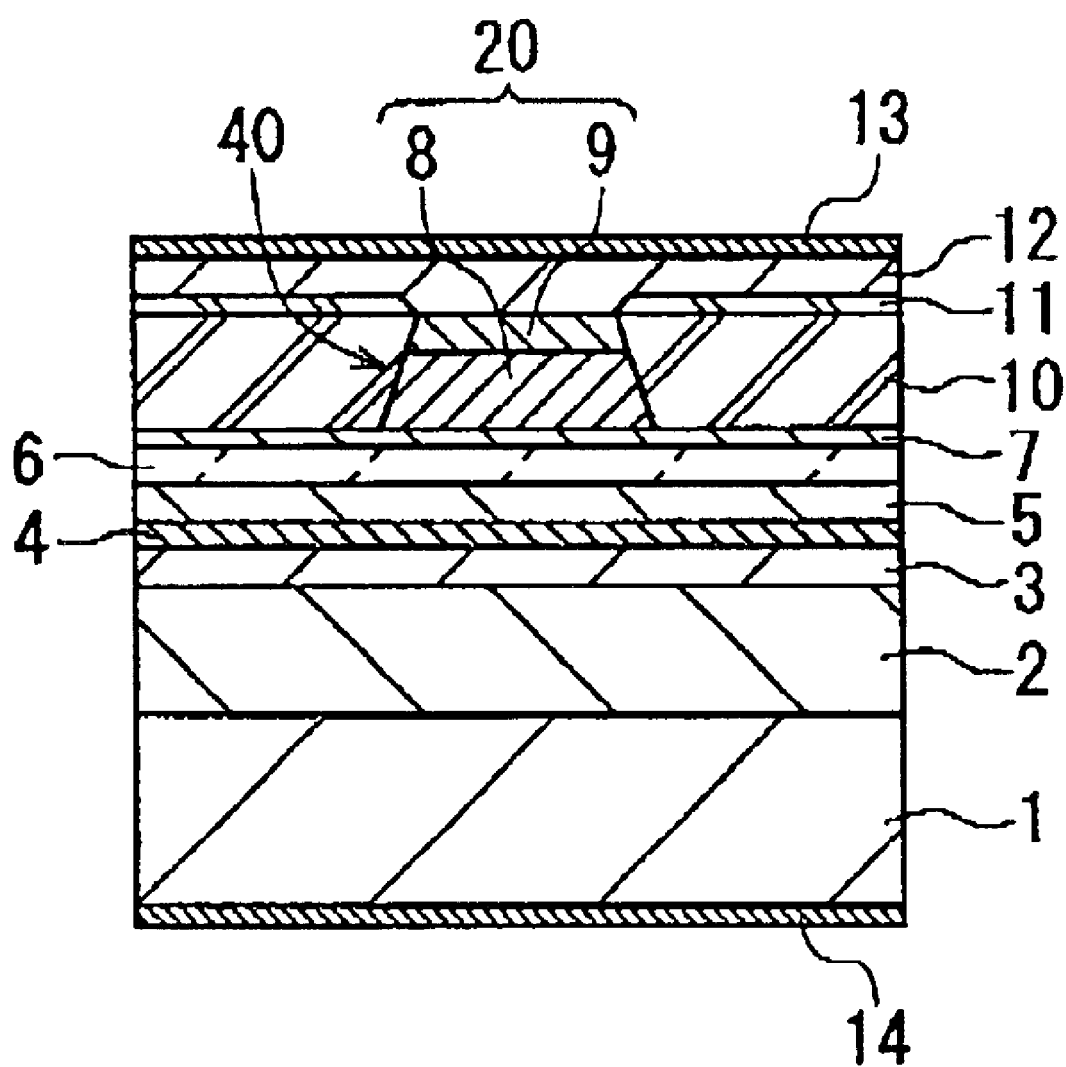
FIG. 13 is a vertical, cross-sectional view along the line XIII—XIII in FIG. 11, which shows the configuration of the laser according to the second embodiment of FIG. 11.
Figure 14:
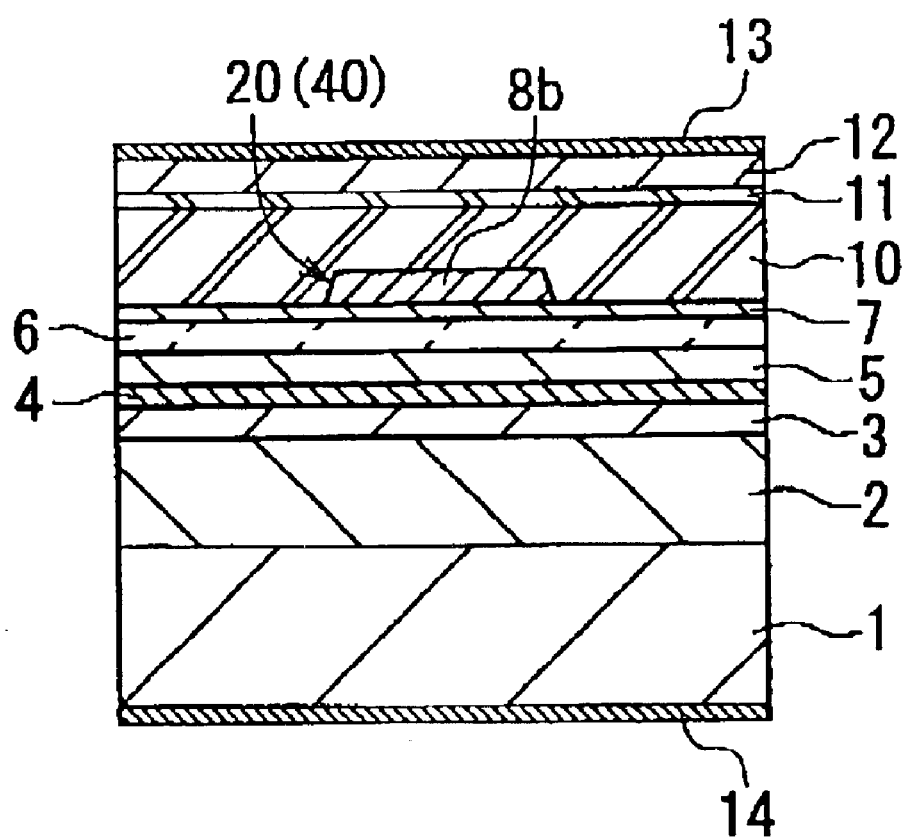
FIG. 14 is a vertical, cross-sectional view along the line XIV—XIV in FIG. 11, which shows the configuration of the laser according to the second embodiment of FIG. 11.

Unlike the laser of the first embodiment, as clearly shown in FIG. 11, the p-type second cladding layer 8 is partially removed at its ends near the front and rear edges 31 and 32 of the layered structure, thereby forming two depressions. Because of these depressions, these parts of the layer 8 are thinned. The n-type current blocking layer 10 is partially fitted into these depressions. As a result, the plan shape of the layer 10 (and the n-type current blocking layer 11) is like the O character. The thinned parts 8a and 8b of the layer 8 are formed to limit the current injection into the waveguide 40 when the laser is operated. The parts 8a and 8b are termed the "current non-injection regions" of the layer 8.

On the n-type GaAs current blocking layer 11 and the p-type GaAs cap layer 9 exposed from the opening of the layer 11, the p-type GaAs contact layer 12 is formed. On the layer 12, the p-side electrode 13 made of TiPtAu is formed. On the back (lower surface) of the n-type GaAs substrate 1, the n-side electrode 14 made of AuGeNi is formed.

Figure 15:
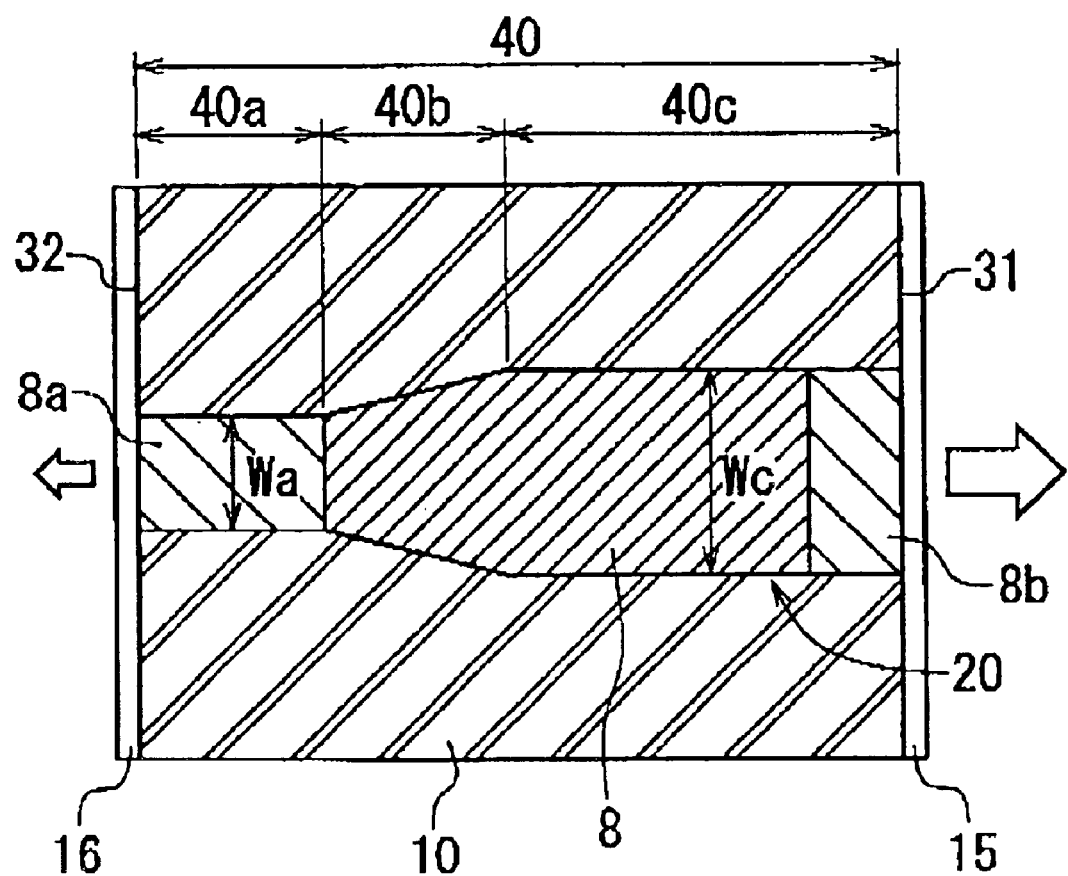
FIG. 15 is a horizontal, cross-sectional view along the line XV—XV in FIG. 11, which shows the configuration of the laser according to the second embodiment of FIG. 11.

The waveguide 40 extending along the ridge structure 20 has a symmetrical plan shape with respect to its longitudinal axis, as shown in clearly FIG. 15. The waveguide 40 comprises the straight part 40a with a relatively small width Wa, the straight part 40c with a relatively large width Wc, and the tapered part 40b connecting the straight parts 40a and 40c to each other. The outer end (the left end in FIG. 15) of the straight part 40a is connected to the rear edge 32 of the laser. The outer end (the right end in FIG. 15) of the straight part 40c is connected to the front edge (i.e., the emission edge) 31 of the laser. These are the same as the first embodiment.

In this way, with the laser according to the second embodiment, the current non-injection regions 8a and 8b are respectively formed near the front and rear edges 31 and 32 in such a way as to contact the edges 31 and 32, respectively.

Next, a method of fabricating the above-described semiconductor laser according to the second embodiment is explained below with reference to FIGS. 16A and 16B to 21A and 21S.

Figure 16A:
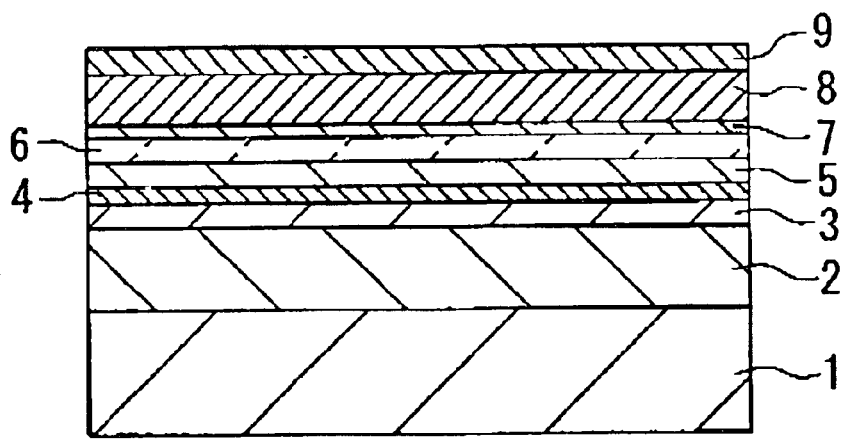
FIGS. 16A and 16B are a longitudinal, vertical, cross-sectional view along the resonator and a plan view, respectively, which show a method of fabricating the laser according to the second embodiment of FIG. 11.
Figure 16B:
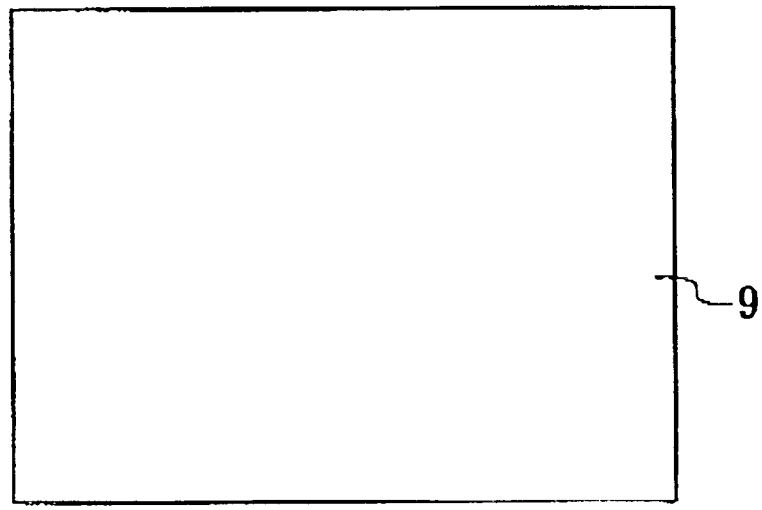

First, in the same way as the first embodiment, the n-type $Al_{0.3}Ga_{0.7}As$ cladding layer 2, the n-type $Al_{0.1}Ga_{0.9}As$ confining layer 3, the i-type double QW active layer 4, the p-type $Al_{0.1}Ga_{0.9}As$ confining layer 5, the p-type $Al_{0.3}Ga_{0.7}As$ first cladding layer 6, the p-type $Al_{0.45}Ga_{0.55}As$ etch stop layer 7, the p-type $Al_{0.3}Ga_{0.7}As$ second cladding layer 8, and the p-type GaAs cap layer 9 are successively formed on the n-type GaAs substrate 1 in this order. The state at this stage is shown in FIGS. 16A and 16B.

Figure 17A:
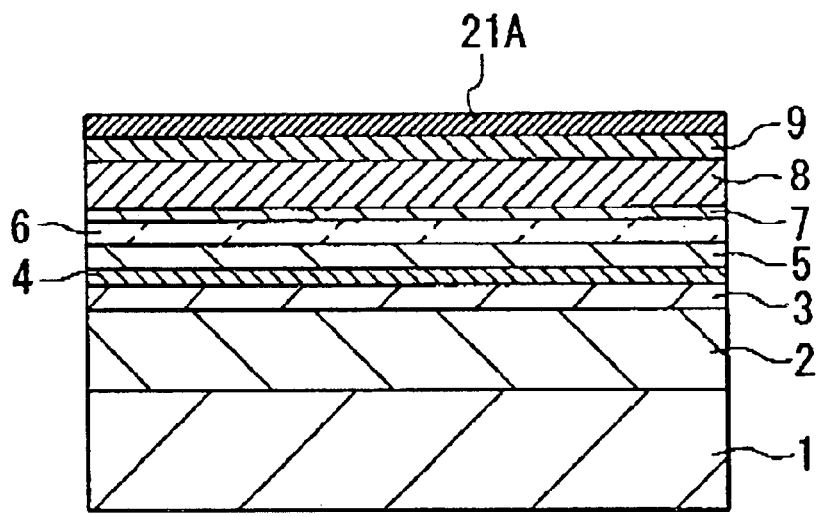
FIGS. 17A and 17B are a longitudinal, vertical, cross-sectional view along the resonator and a plan view, respectively, which show the method of fabricating the laser according to the second embodiment of FIG. 11.
Figure 17B:
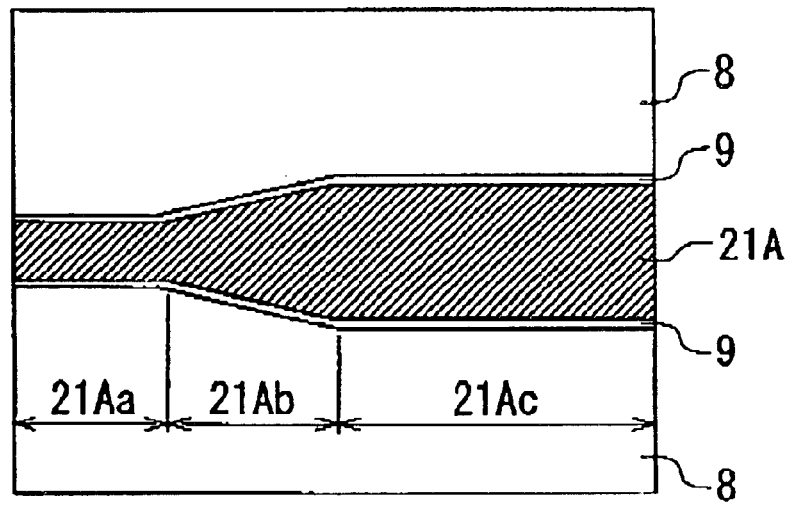

Subsequently, a dielectric layer (e.g., a $SiO_2$ layer) (not shown) is formed on the p-type cap layer 9 and then, it is selectively etched by the known photolithography and etching techniques, thereby patterning the dielectric layer, as shown in FIGS. 17A and 17B. Thus, a dielectric mask 21A is formed on the cap layer 9. This mask 21A is used to etch only the underlying layer 9. The pattern (i.e., the plan shape) of the mask 21A is approximately in accordance with the plan shapes of the optical waveguide 40 and the ridge structure 20.

Like the first embodiment, the dielectric mask 21A comprises a stripe-shaped light blocking region 21Aa with a constant thickness, a tapered light blocking region 21Ab with a varying thickness, and a stripe-shaped light blocking region 21Ac with a constant thickness. For example, the width and length of the region 21Aa are 3.5 μm and 400 μm, respectively. The width and length of the region 21Ab are from 3.5 μm to 5 μm, and 200 μm, respectively. The width and length of the region 21Ac are 5 μm and 200 μm, respectively.

Using the dielectric mask 21A, the p-type cap layer 9 is selectively etched, thereby selectively exposing the p-type second cladding layer 8.

Figure 18A:
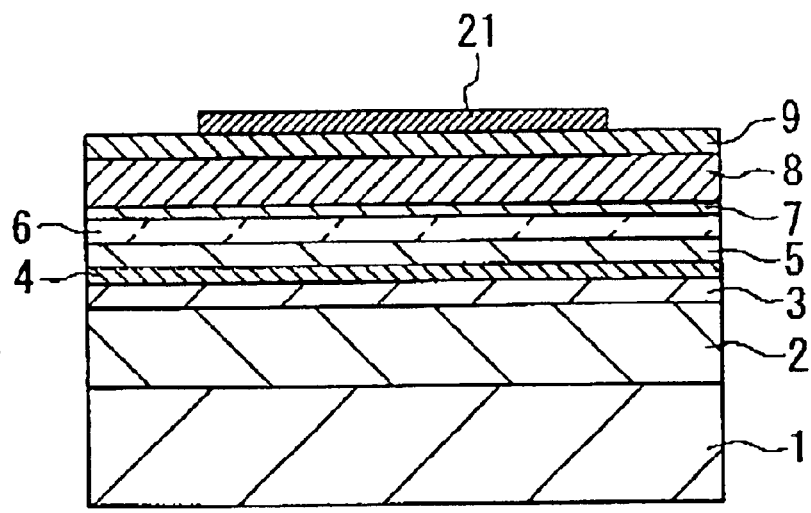
FIGS. 18A and 18B are a longitudinal, vertical, cross-sectional view along the resonator and a plan view, respectively, which show the method of fabricating the laser according to the second embodiment of FIG. 11.
Figure 18B:
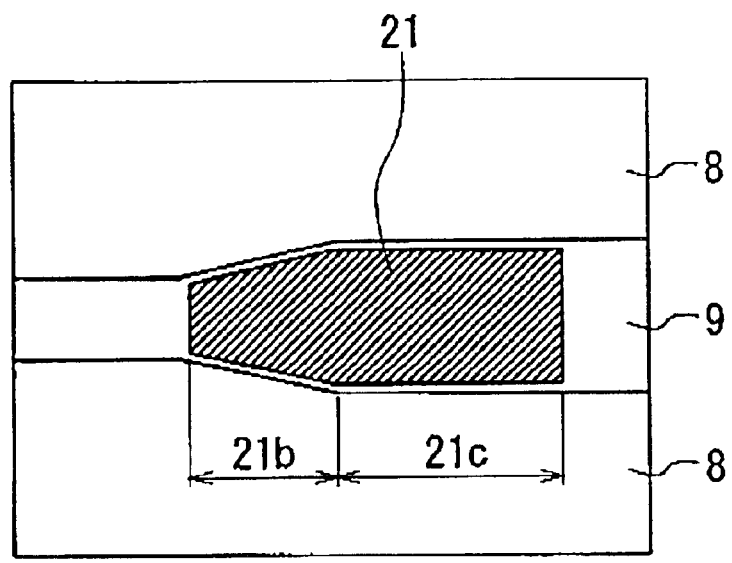

Next, the mask 21A itself is partially etched in such a way that the entire stripe-shaped blocking region 21Aa and the front-side end of the stripe-shaped blocking region 21Ac (in other words, the parts to be the current non-injection regions 8a and 8b of the waveguide 40) are selectively removed. Thus, a dielectric mask 21 shown in FIGS. 18A and 18B is formed from the mask 21Aa. The mask 21 thus formed is to selectively expose the cap layer 9 at the location corresponding to the entire blocking region 21Aa and the location corresponding to the front-side end of the blocking region 21Ac. The mask 21 comprises a tapered light blocking region 21b and a stripe-shaped light blocking region 21c.

Using the dielectric mask 21, the stripe-shaped parts of the p-type cap layer 9 left on the parts corresponding to the regions 21Aa and 21Ac of the mask 21A, and the p-type second cladding layer 8 (which has not been etched so far) are selectively etched. Thus, the mesa-type ridge structure 20 is formed, as shown in FIGS. 19A and 19B.

The ridge structure 20 thus formed comprises a stripe-shaped region 20a, a tapered region 20b, and a stripe-shaped region 20c, which reflect the shape of the mask 21 and the shapes, of the remaining stripe-like parts of the cap layer 9.

Figure 19A:
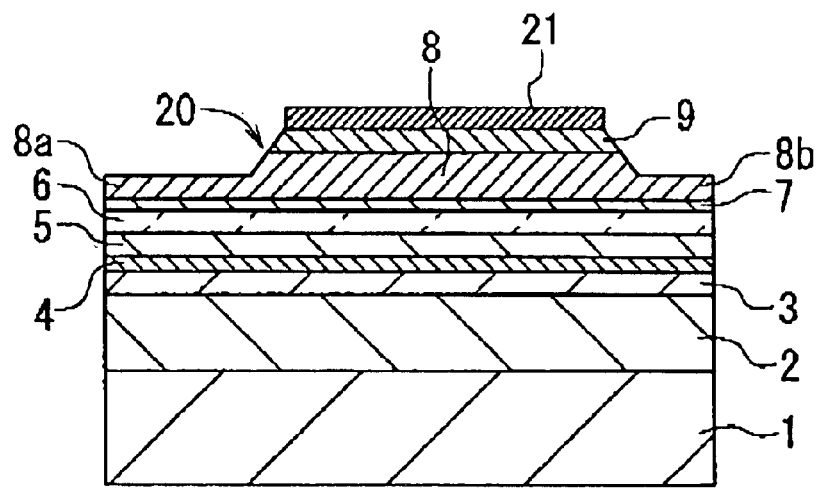
FIGS. 19A and 19B are a longitudinal, vertical, cross-sectional view along the resonator and a plan view, respectively, which show the method of fabricating tho laser according to the second embodiment of FIG. 11.
Figure 19B:
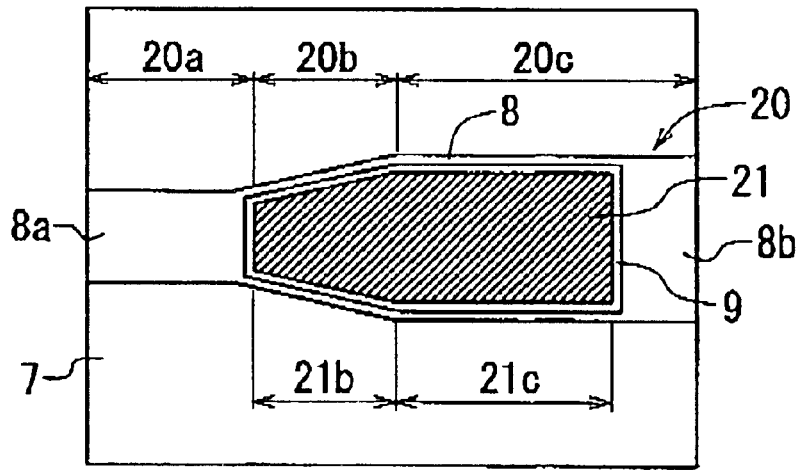

In the state of FIGS. 19A and 19B, the second cladding layer 8 with a certain thickness (e.g., approximately 200 nm) is left on the two locations corresponding to the etched parts of the cap layer 9. Thus, the parts of the layer 8 left on these locations constitute the current non-injection regions 8a and 8b. Since these regions 8a and 8b are continuous with the cladding layer 8 existing in the ridge structure 20, the parts of the waveguide 40 formed by the regions 8a and 8b and the remaining part of the waveguide 40 formed by the cladding layer 8 in the structure 20 are optically coupled with each other with practically no loss.

The current non-injection region 8a near the rear edge 16 is equal in length to the whole part 40a of the waveguide 40. However, needless to say, the region 8a may be shorter than the part 40a (i.e., the fundamental mode section) to decrease the propagation loss of light. Moreover, while taking the propagation loss of light into consideration, the current non-injection region 8b near the, front edge 15 is shorter than the whole part 40c of the waveguide 40.

Figure 20A:
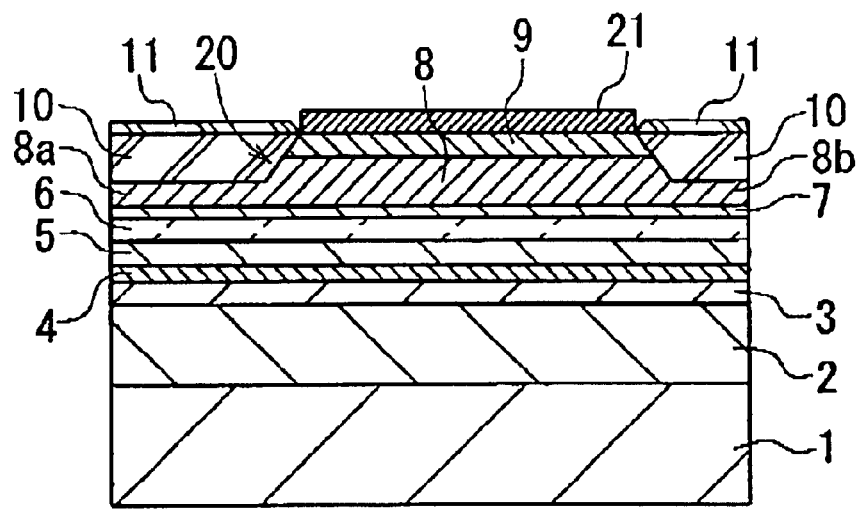
FIGS. 20A and 20B are a longitudinal, vertical, cross-sectional view along the resonator and a plan view, respectively, which show the method of fabricating the laser according to the second embodiment of FIG. 11.
Figure 20B:
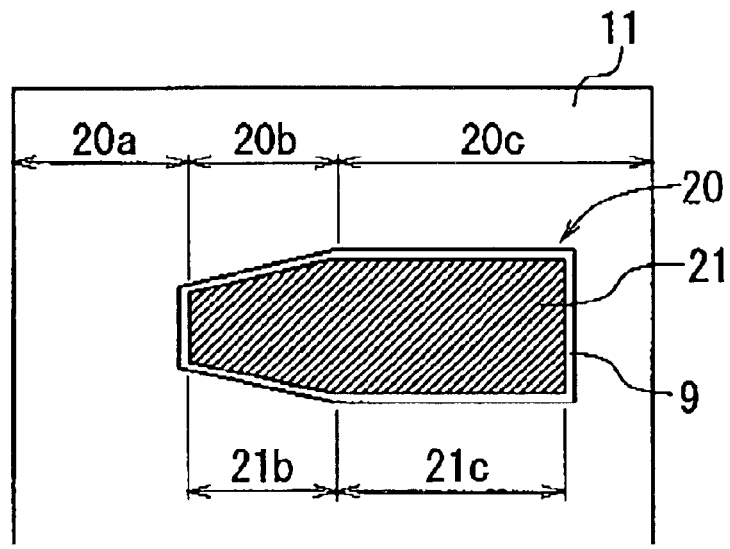

Thereafter, while leaving the mask 21 on the ridge structure 20, the n-type AlGaAs current blocking layer 10 and the n-type GaAs current blocking layer 11 are selectively grown on the etch stop layer 7 in this order. Thus, as shown in FIGS. 20A and 20I, the spaces existing on the etch stop layer 7 and the current non-injection regions 8a are filled with the current blocking layers 10 and 11. Here, the top face of the lower current blocking layer 10 is adjusted in such a way as to have approximately the same height as the remaining second cladding layer 8. As a result, the upper current blocking layer 11 is located above the layer 8.

Figure 21A:
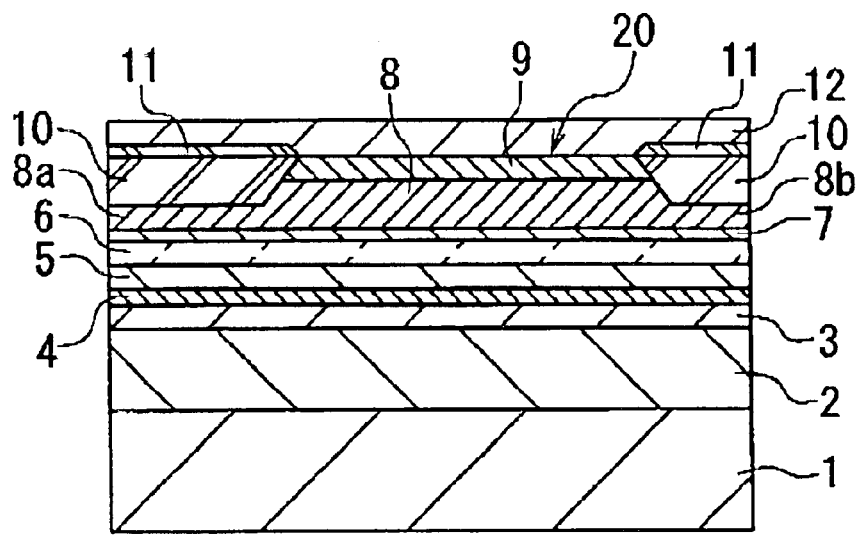
FIGS. 21A and 21B are a longitudinal, vertical, cross-sectional view along the resonator and a plan view, respectively, which show the method of fabricating the laser according to the second embodiment of FIG. 11.
Figure 21B:
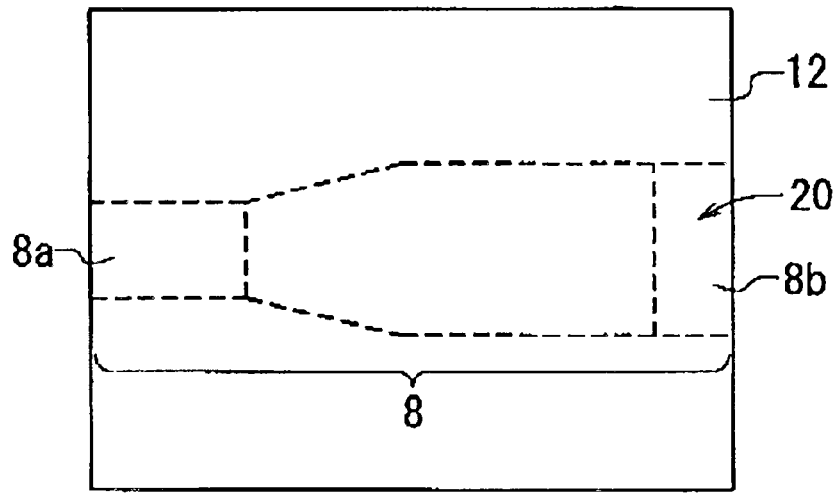

After removing the dielectric mask 21, the p-type GaAs contact layer 12 is grown on the current blocking layer 11 and the cap layer 9 exposed from the opening of the layer 11, resulting in the structure shown in FIGS. 21A and 21B. In this stage, the contact layer 12 covers the cap layer 9. The layer 12 is formed to cover the whole surface of the substrate 1.

Subsequently, in the same way as the first embodiment, the semiconductor laser according to the second embodiment having the configuration of FIG. 11 is completed.

With the edge emitting semiconductor laser according to the second embodiment, the same advantages as those in the first embodiment are obtainable. This is because the laser of the second embodiment has a configuration obtained by adding the current non-injection region 8b to the relatively wide straight part 40c of the waveguide 40.

Additionally, since the current non-injection regions 8a and 8b are provided in the second cladding layer 8 for suppressing or controlling the current injection into the active layer 4, the effect of suppressing the "beam steering" is enhanced compared with the first embodiment. As a result, the maximum output of the laser for the fundamental mode can be raised furthermore.

Because the two current non-injection regions 8a and 8b are provided at the respective ends of the second cladding layer 8, the heat generation at the front and rear edges 31 and 32 is suppressed or restrained. Thus, the possibility that COD or COMD occurs at the emission edge 31 is lowered compared with the first embodiment. This means that there is another additional advantage that not only the high output characteristics but also the reliability improvement at the edge 31 are obtainable.

Third Embodiment

FIGS. 22 to 25 show the configuration of an edge emitting semiconductor laser (980 nm band) according to a third embodiment of the invention. This laser comprises a current non-injection region 8c formed in the second cladding layer 8 instead of the current non-injection region 8a provided in the first embodiment. The region 8c is realized by using a current-injection suppressing mask 17 formed on the p-type GaAs contact layer 12. The change of the shape of the second cladding layer 8 as used in the first and second embodiments is not utilized in the third embodiment.

The laser of the third embodiment has the same configuration as the semiconductor laser of the first embodiment except for the above-identified structure. Therefore, the explanation about the same configuration is omitted here for the sake of simplification by attaching the same reference symbols as used in the first embodiment to the respective elements in FIGS. 22 to 25.

The laser of the third embodiment does not have the depression formed in the second cladding layer 8 in the first embodiment. The thickness of the layer 8 is constant over the whole length of the ridge structure 20 (i.e., the waveguide 40). The current blocking layers 10 and 11 cover each side of the structure 20 only, in other words, they do not overlap with the structure 20.

Figure 25:
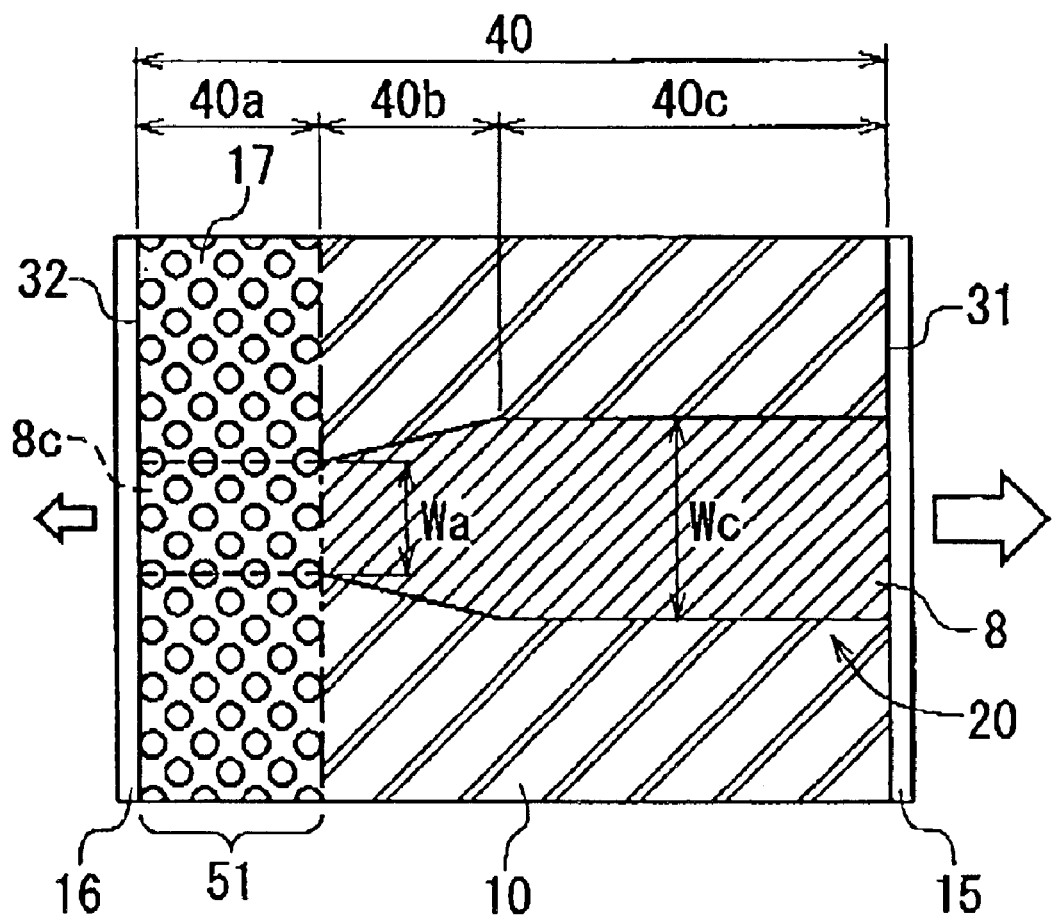
FIG. 25 is a horizontal, cross-sectional view along the line XXV—XXV in FIG. 22, which shows the configuration of the laser according to the third embodiment of FIG. 22.

The waveguide 40 extending along the ridge structure 20 has a symmetrical plan shape with respect to its longitudinal axis, as shown in FIG. 25. The waveguide 40 comprises the straight part 40a with a relatively small width Wa, the straight part 40c with a relatively large width Wc, and the tapered part 40b connecting the straight parts 40a and 40c to each other.

The current-injection suppressing mask 17 is formed on the p-type GaAs contact layer 12. As clearly shown in FIG. 25, the mask 17 is rectangular and overlapped with the whole straight part 40a with the relatively small width Wa. The mask 17, which is made of a dielectric layer (e.g., $SiO_2$ layer) with penetrating openings, is entirely covered with the p-side electrode 13. The current to be injected into the inside of the laser through the p-side electrode 13 on operation is suppressed by the mask 17 and therefore, the current scarcely reaches the portion of the second cladding layer 8 corresponding to the straight part 40a. Thus, substantially no current is injected into this portion. This portion is the current non-injection region 8c. In this way, the region 8c is formed in the layer 8 by the function of the mask 17.

Because of the current non-injection region 8c, the same advantages as those in the first embodiments are obtainable in the laser of the third embodiment.

The reference numeral 51 shown in FIG. 25 denotes the range of the p-side electrode 13 where the current injection is suppressed.

Next, a method of fabricating the above-described semiconductor laser according to the third embodiment is explained below.

First, in the same way as the first embodiment, the n-type $Al_{0.3}Ga_{0.7}As$ cladding layer 2, the n-type $Al_{0.1}Ga_{0.9}As$ confining layer 3, the i-type double QW active layer 4, the p-type $Al_{0.1}Ga_{0.9}As$ confining layer 5, the p-type $Al_{0.3}Ga_{0.7}As$ first cladding layer 6, the p-type $Al_{0.45}Ga_{0.55}As$ etch stop layer 7, the p-type $Al_{0.3}Ga_{0.7}As$ second cladding layer 8, and the p-type GaAs cap layer 9 are successively formed on the n-type GaAs substrate 1 in this order.

Subsequently, a dielectric layer (e.g., a $SiO_2$ layer) is formed on the p-type cap layer 9 and then, it is selectively etched by the known photolithography and etching techniques, thereby patterning the dielectric layer, as shown in FIGS. 17A and 17B. Thus, a dielectric mask 21A is formed on the cap layer 9. The pattern (i.e., the plan shape) of the mask 21A is approximately in accordance with the plan shapes of the optical waveguide 40 and the ridge structure 20.

Like the first embodiment, the dielectric mask 21A comprises the stripe-shaped light blocking region 21Aa with a constant width, the tapered light blocking region 21Ab with a varying width, and the stripe-shaped light blocking region 21Ac with a constant width. For example, the width and length of the region 21Aa are 3.5 μm and 400 μm, respectively. The width and length of the region 21Ab are from 3.5 μm to 5 μm, and 200 μm, respectively. The width and length of the region 21Ac are 5 μm and 200 μm, respectively.

Using the dielectric mask 21A, the p-type cap layer 9 and the p-type second cladding layer 8 are selectively etched to thereby form the mesa-type ridge structure 20. The ridge structure 20 thus formed comprises the stripe-shaped region 20a, the tapered region 20b, and the stripe-shaped region 20c, which reflect the shape of the mask 21A. In this state, the thickness of the second cladding layer 8 is constant over its whole length.

Thereafter, while leaving the mask 21A on the ridge structure 20, the n-type AlGaAs current blocking layer 10 and the n-type GaAs current blocking layer 11 are selectively grown on the etch stop layer 7 in this order. Thus, the spaces existing on the etch stop layer 7 at each side of the structure 20 are filled with the current blocking layers 10 and 11.

After removing the dielectric mask 21A, the p-type GaAs contact layer 12 is grown on the current blocking layer 11 and the cap layer 9 exposed from the opening of the layer 11, resulting in the structure shown in FIGS. 21A and 21B. Then, a SiO₂ layer is formed on the contact layer 12 and patterned, thereby forming the current-injection suppressing mask 17 with the penetrating holes, an shown in FIG. 25.

Figure 22:
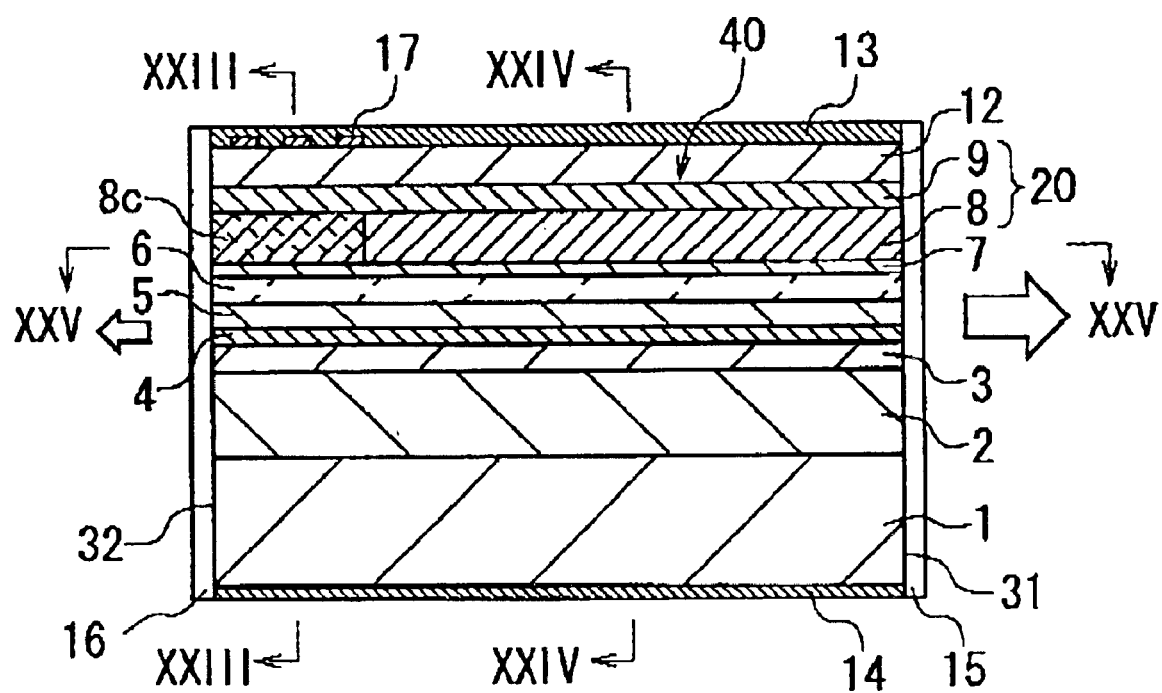
FIG. 22 is a longitudinal, vertical, cross-sectional view showing the configuration of a semiconductor laser according to a third embodiment of the invention.
Figure 23:
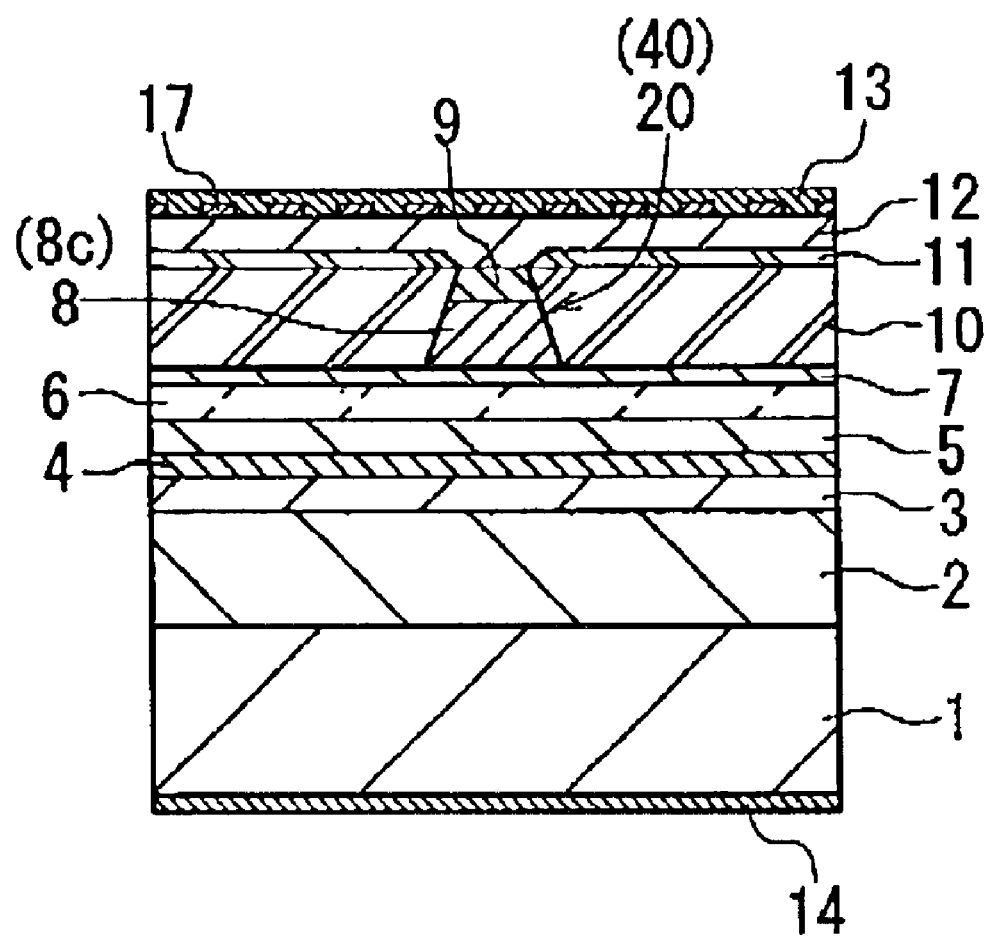
FIG. 23 is a vertical, cross-sectional view along the line XXIII—XXIII in FIG. 22, which shows the configuration of the laser according to the third embodiment of FIG. 22.
Figure 24:
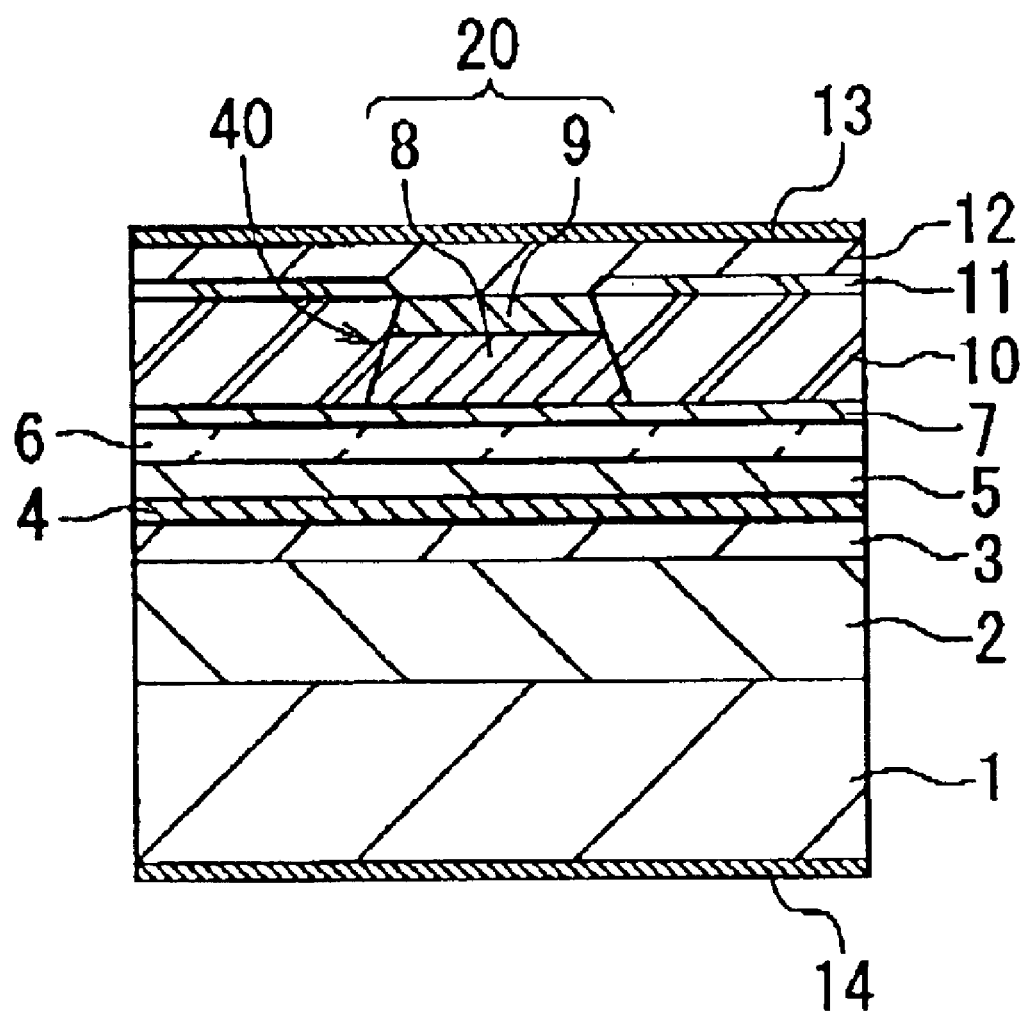
FIG. 24 is a vertical, cross-sectional view along the line XXIV—XXIV in FIG. 22, which shows the configuration of the laser according to the third embodiment of FIG. 22.

Subsequently, the p-side electrode 13 is formed on the contact layer 12 to cover the whole mask 17. The following processes are the same as the first embodiment. As a result, the semiconductor laser according to the third embodiment having the configuration of FIG. 22 is completed.

With the edge emitting semiconductor laser according to the third embodiment, the current non-injection region 8c is formed in the relatively narrow straight part (i.e., the fundamental mode section) 40a of the waveguide 40 and therefore, the same advantages as those in the first embodiment are obtainable.

Additionally, since the process of etching the dielectric mask 21A to form the dielectric mask 21 is unnecessary, there is an additional advantage that the fabrication process sequence is simpler than the first embodiment.

In the laser of the third embodiment, the current non-injection region 8a used in the first embodiment may be additionally provided, or the two current non-injection regions 8a and 8b used in the second embodiment may be additionally provided.

Fourth Embodiment

FIGS. 26 to 29 show the configuration of an edge emitting semiconductor laser (980 nm band) according to a fourth embodiment of the invention. This laser has the same configuration as the first embodiment except that an ion-implanted part 18 is additionally formed by implanting the ions of a dopant into the part including the current non-injection region 8a of the second cladding layer 8. Therefore, the current non-injection region 8a including the dopant ions is indicated by "8d".

The ion-implanted part 18 contains the entire current non-injection region 8a and part of the active layer 4. The band gap (i.e., forbidden band width) of the active layer 4 is increased in the part 18 due to the implanted dopant ions compared with the outside of the part 18. Thus, the part of the active layer 4 located in the part 18 is inactive. In other words, the part of the waveguide 40 existing in the part 18 serves as a passive waveguide having no gain with respect to laser light.

Figure 29:
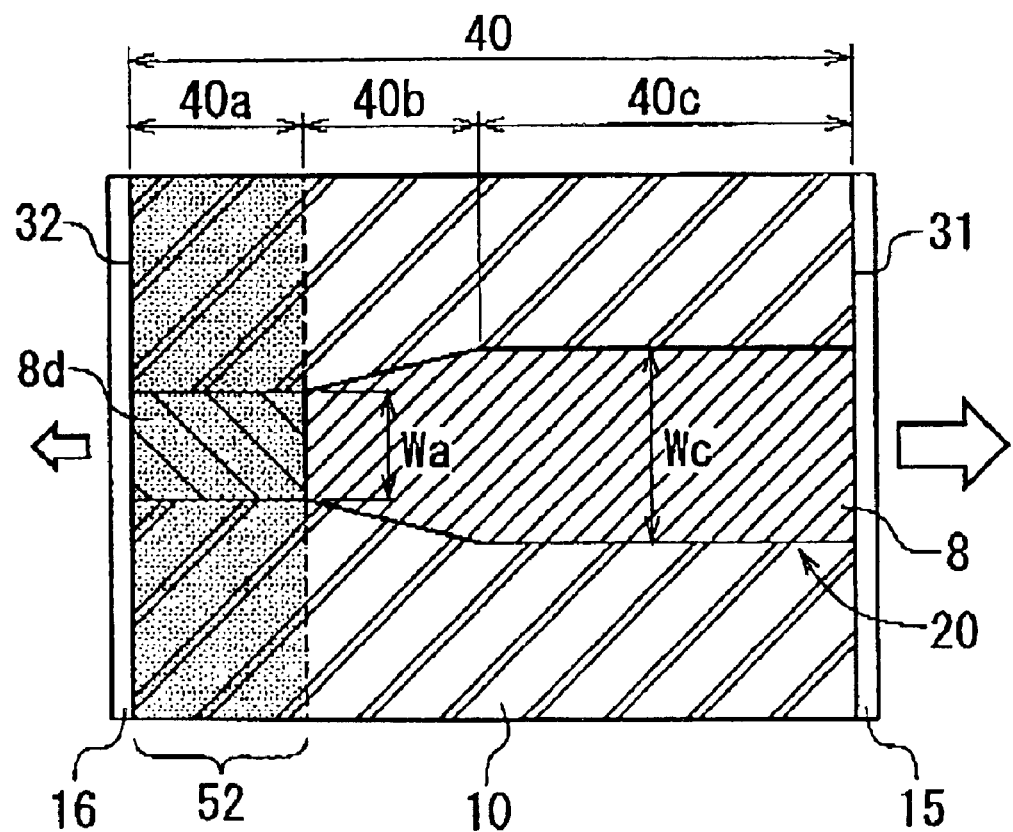
FIG. 29 is a horizontal, cross-sectional view along the line XXIX—XXIX in FIG. 26, which shows the configuration of the laser according to the fourth embodiment of FIG. 26.

As shown in FIG. 29, the ion-implanted part 18 is located in, such a way as to overlap with the whole relatively narrow straight part 40a of the waveguide 40 and to contact the rear edge 32. The reference numeral "52" in FIG. 29 denotes the range into which the dopant ions are implanted.

The laser of the fourth embodiment has the ion-implanted part 18 in addition to the current non-injection region 8d. However, the region 8d may be omitted, in which only the ion-implanted part 18 is present. In this case also, the same advantages as the fourth embodiment are obtainable. This is because the part of the active layer 4 in the part 18 is inactive and therefore, the current injection into the straight part 40a is suppressed or prevented in the same way as the fourth embodiment even if the region 8d in eliminated.

Next, a method of fabricating the above-described semiconductor laser according to the fourth embodiment is explained below.

The process steps from the start to the formation (see FIGS. 8A to 8C) of the current non-injection region 8d are the same as those of the first embodiment. In the state of FIGS. 8A to 8C, the second cladding layer 8 with a certain thickness (e.g., approximately 200 nm) is left on the location corresponding to the remaining cap layer 9. Thus, the remaining part of the layer 8 constitutes the current non-injection region 8d.

Subsequently, a dopant such as Si, Zn, or the like is selectively ion-implanted into the region 52 containing the current non-injection region 8d. An annealing process is then carried out at a proper temperature. Since these processes are well known, detailed explanation on them are omitted here. As a result, the dopant ions are introduced into the part of the active layer 4 in the ion-implanted part 18, thereby enlarging the band gap of the layer 4.

Thereafter, while leaving the mask 21 on the ridge structure 20, the n-type AlGaAs current blocking layer 10 and the n-type GaAs current blocking layer 11 are selectively grown on the etch stop layer 7 in this order. Thus, the spaces existing on the etch stop layer 7 are filled with the current blocking layers 10 and 11.

Figure 26:
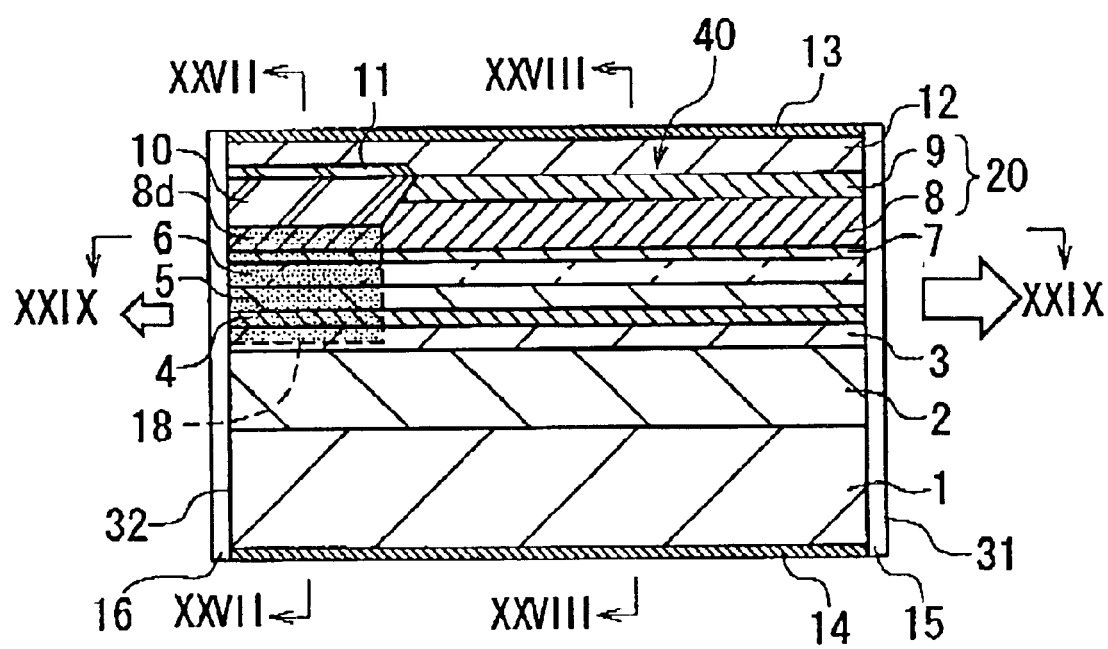
FIG. 26 is a longitudinal, vertical, cross-sectional view showing the configuration of a semiconductor laser according to a fourth embodiment of the invention.
Figure 27:
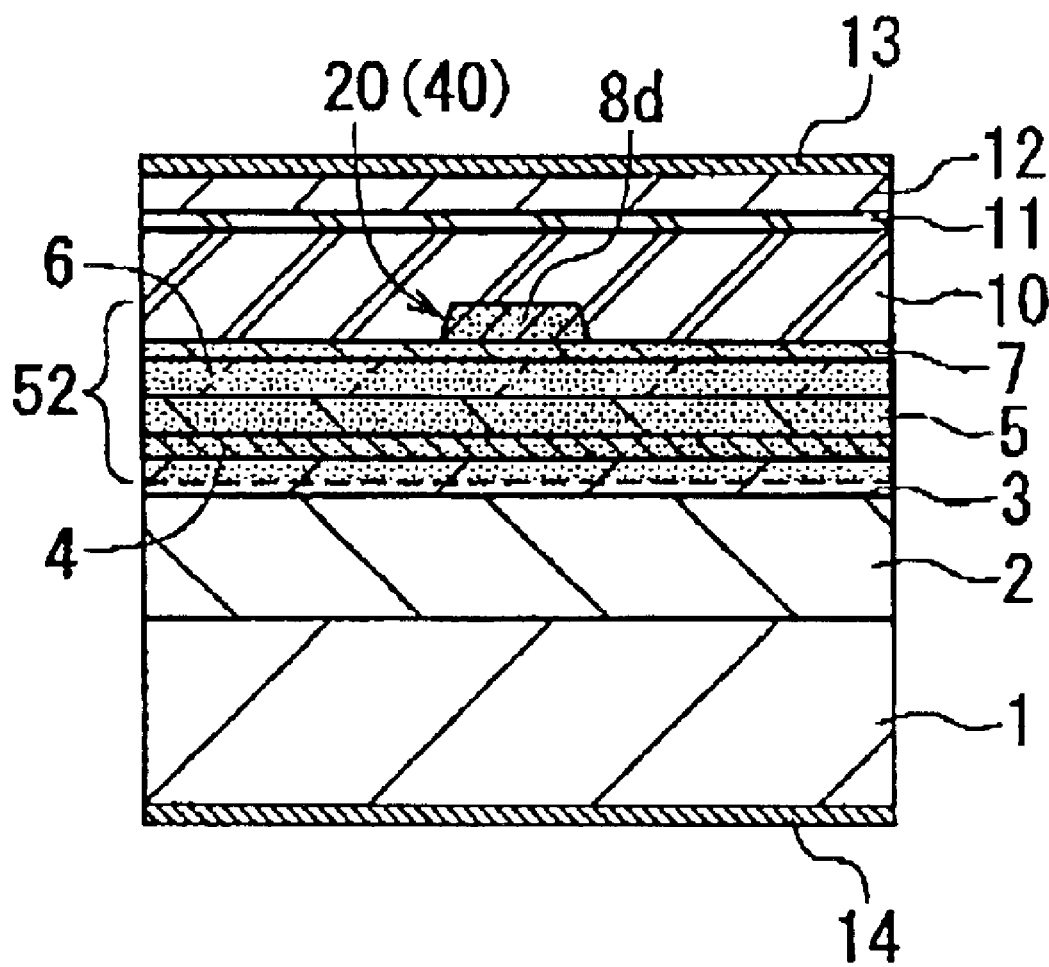
FIG. 27 is a vertical, cross-sectional view along the line XXVII—XXVII in FIG. 26, which shows the configuration of the laser according to the fourth embodiment of FIG. 26.
Figure 28:
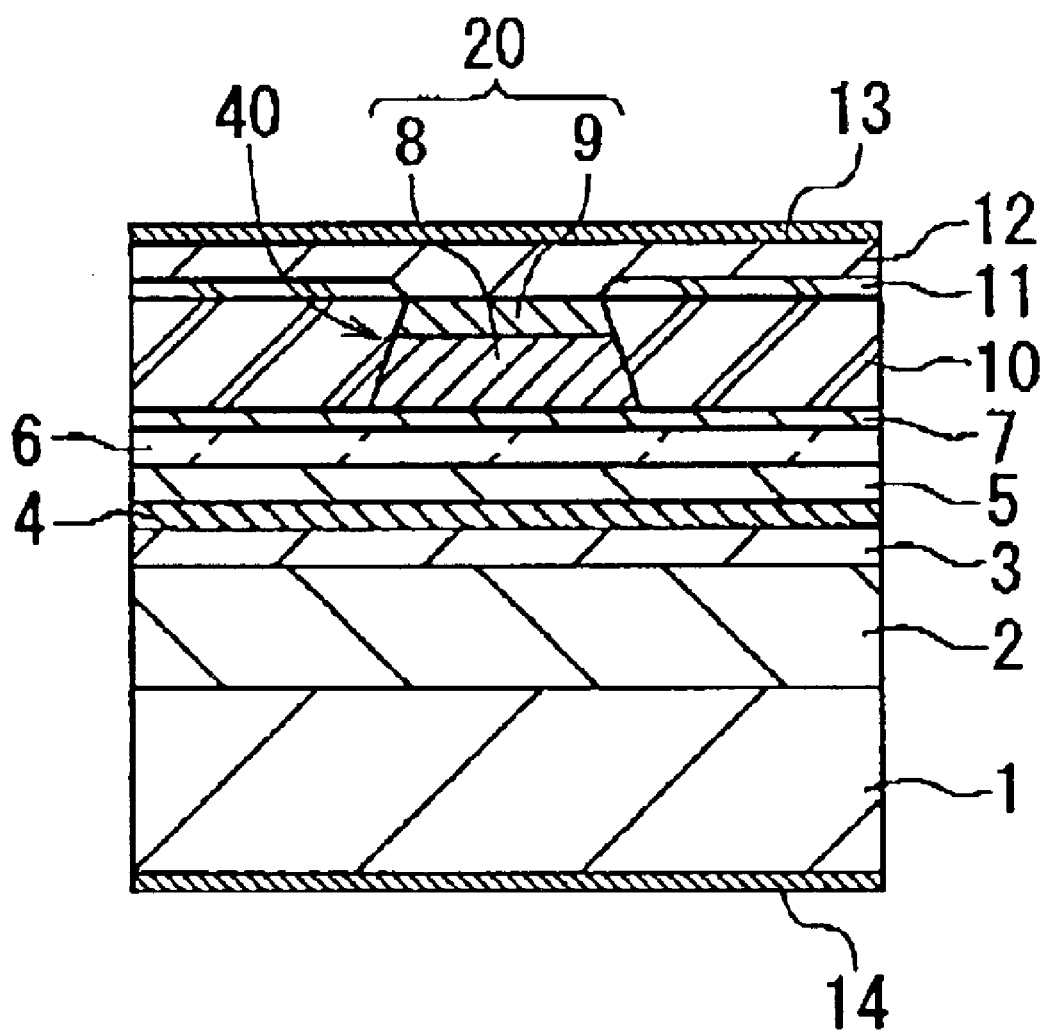
FIG. 28 is a vertical, cross-sectional view along the line XXVIII—XXVIII in FIG. 26, which shows the configuration of the laser according to the fourth embodiment of FIG. 26.

After removing the dielectric mask 21, the p-type GaAs contact layer 12 is grown on the current blocking layer 11 and the cap layer 9 exposed from the opening of the layer 11. The following processes are the same as the first embodiment. As a result, the semiconductor laser according to the fourth embodiment having the configuration of FIG. 26 is completed.

With the edge emitting semiconductor laser according to the fourth embodiment, the current non-injection region 8d is formed in the relatively narrow straight part (the fundamental mode section) 40a of the waveguide 40 and at the same time, the band gap of the active layer 4 in the ion-implanted part 18 is expanded. Therefore, the obtainable advantages of the first embodiment are enhanced.

Even if the current non-injection region 8d is omitted from the above-described laser configuration of the fourth embodiment, approximately the same advantages as those in the first embodiment are obtainable.

In addition, as seen from above, the current non-injection region 8a used in the first embodiment is provided in the laser of the fourth embodiment. However, instead of the region 8a, the two current non-injection regions 8a and 8b used in the second embodiment may be provided in the laser of the fourth embodiment.

Fifth Embodiment

Figure 30:
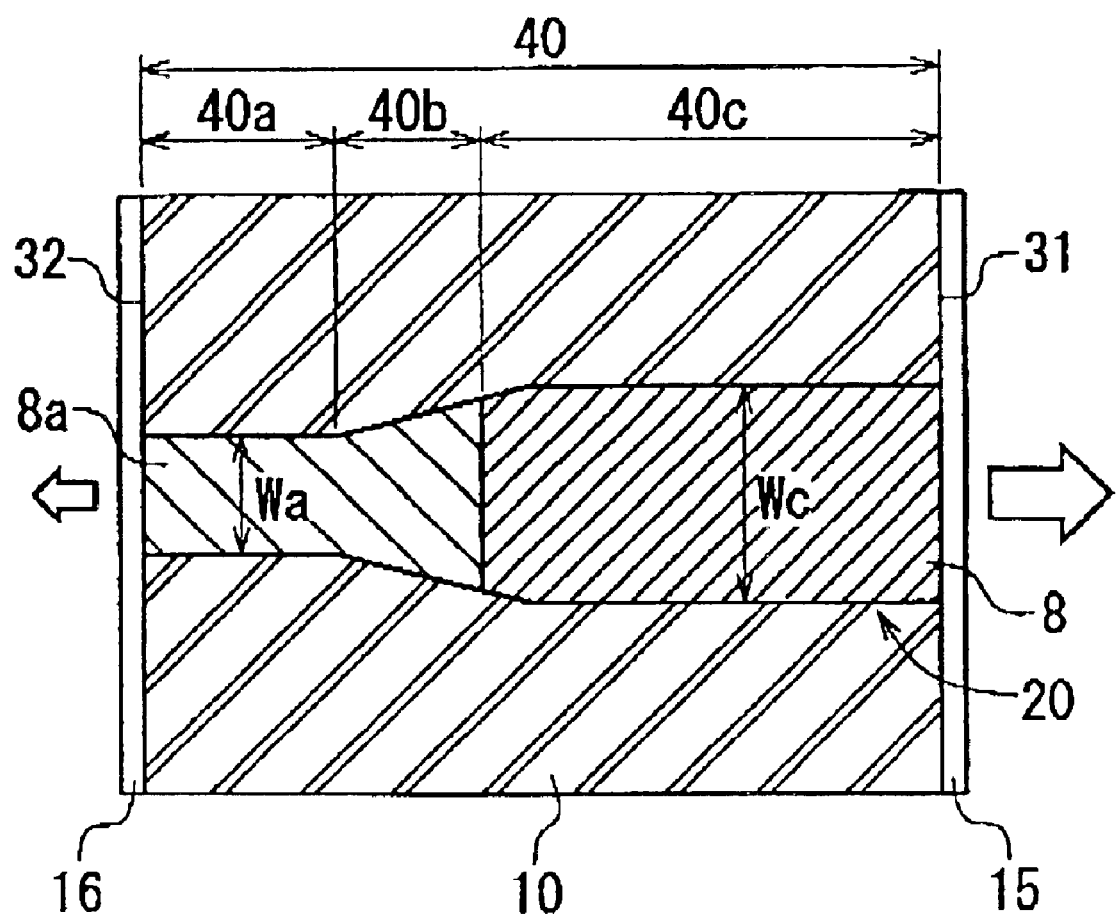
FIG. 30 is a horizontal, cross-sectional view showing the configuration of a semiconductor laser according to a fifth embodiment of the invention, which is along the line IV—IV in FIG. 3.

FIG. 30 shows the configuration of an edge emitting semiconductor laser (980 nm band) according to a fifth embodiment of the invention. This is a variation of the waveguide 40 and is applicable to any of the above-described first to fourth embodiments.

In the laser of the fifth embodiment, the waveguide 40 has the same plan shape as that of the first embodiment.

However, unlike the first embodiment, the current non-injection region 8a is formed to extend from the rear edge 32 to approximately the central position of the tapered part 40b. Thus, the region 8a is overlapped with not only the whole straight part 40a (the fundamental mode section) but also the rear half of the tapered part 40b.

With the laser of the fifth embodiment, compared with the first embodiment, the beam steering is suppressed until a higher level of the injection current density. As a result, the maximum fundamental-mode output of the laser can be raised compared with the first embodiment.

The current non-injection region 8a maybe formed to overlap with the whole straight part 40a and the whole tapered part 40b.

Sixth Embodiment

Figure 31:
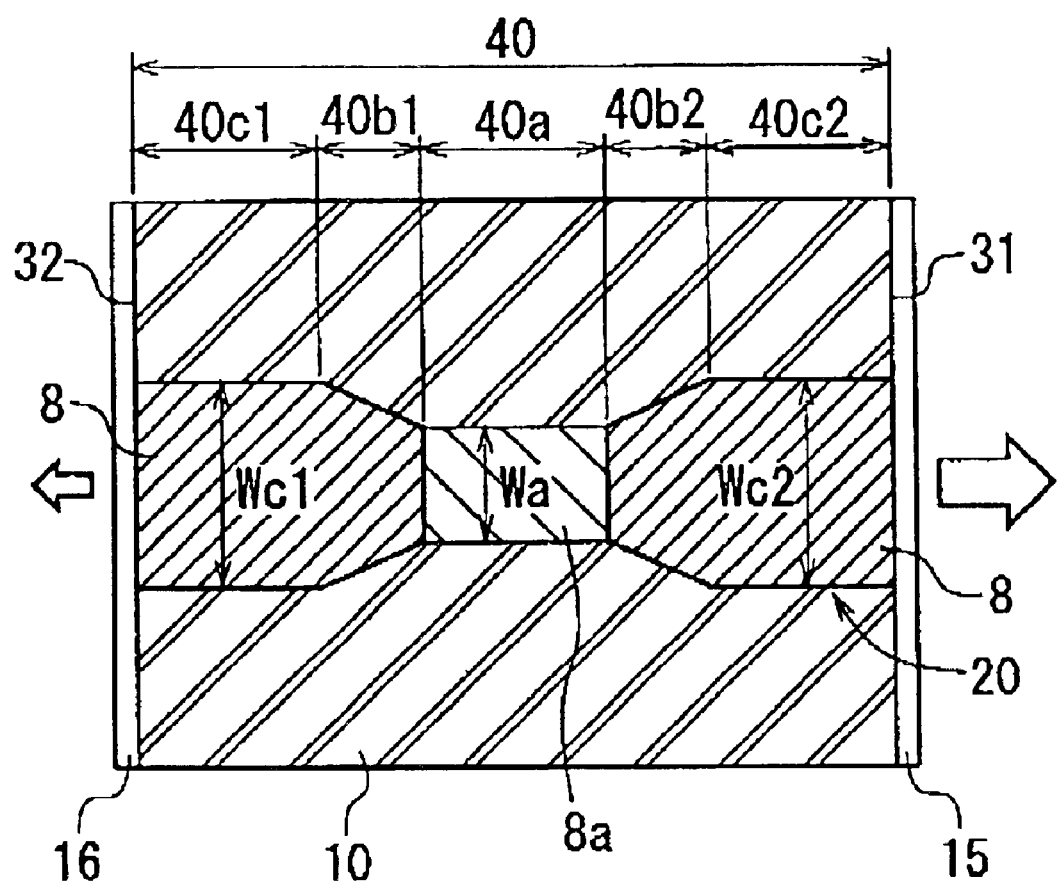
FIG. 31 is a horizontal, cross-sectional view showing the configuration of a semiconductor laser according to a sixth embodiment of the invention, which is along the line IV—IV in FIG. 3.

FIG. 31 shows the configuration of an edge emitting semiconductor laser (980 nm band) according to a sixth embodiment of the invention. This is another variation of the waveguide 40 and is applicable to any of the above-described first to fourth embodiment.

In the laser of the sixth embodiment, the straight part 40a (the fundamental mode section) with a relatively small width Wa of the waveguide 40 is located in the middle of the optical resonator. This is to enhance the endurance or durability of the rear edge 32. The current non-injection region 8a is formed to overlap with the whole straight part 40a.

The plan shape of the waveguide 40 of the sixth embodiment is different from that of the first to fourth embodiments. Specifically, the waveguide 40 comprises a straight part 40a with a relatively small width Wa, a straight part 40c1 with a relatively large width Wc1, a straight part 40c2 with a relatively large width Wc2, a tapered part 40b1 connecting the straight parts 40a and 40c1 to each other, and a tapered part 40b2 connecting the straight parts 40a and 40c2 to each other. The straight part 40a is located between the straight parts 40c1 and 40c2. The widths Wc1 and Wc2 are greater than the width Wa. However, the widths Wc1 and Wc2 may be equal to or different from each other.

The current non-injection region 8a may be formed to overlap with the part of the straight part 40a, to overlap with at least one of the tapered parts 40b1 and 40b2, or to overlap with at least one of the whole tapered parts 40b1 and 40b2.

Seventh Embodiment

Figure 32:
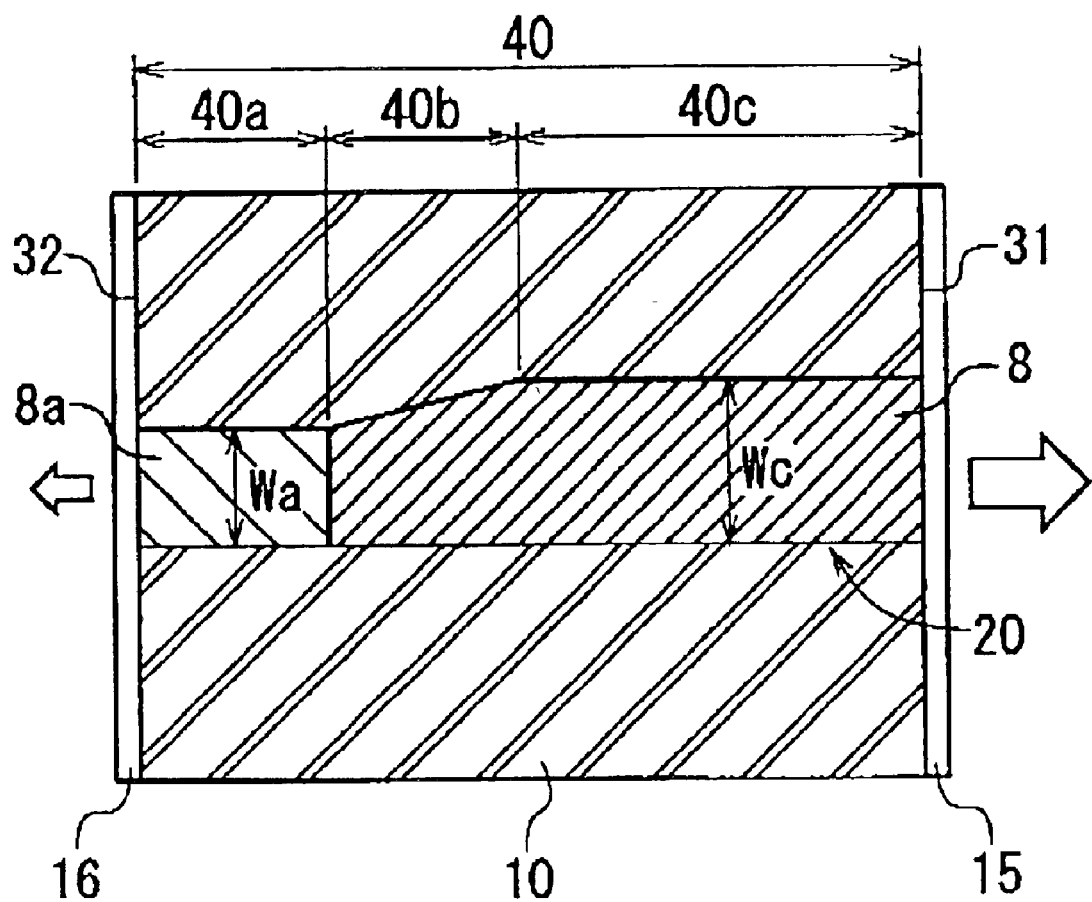
FIG. 32 is a horizontal, cross-sectional view showing the configuration of a semiconductor laser according to a seventh embodiment of the invention, which is along the line IV—IV in FIG. 3.

FIG. 32 shows the configuration of an edge emitting semiconductor laser (980 nm band) according to a seventh embodiment of the invention. This is still another variation of the waveguide 40 and is applicable to any of the above-described first to fourth embodiments.

The laser of the seventh embodiment has the same configuration as the first embodiment except that the plan shape of the waveguide 40 is asymmetrical with respect to its longitudinal axis.

As seen from the seventh embodiment, the plan shape of the waveguide 40 may be asymmetrical with respect to the longitudinal axis of the optical resonator.

Eighth Embodiment

Figure 33:
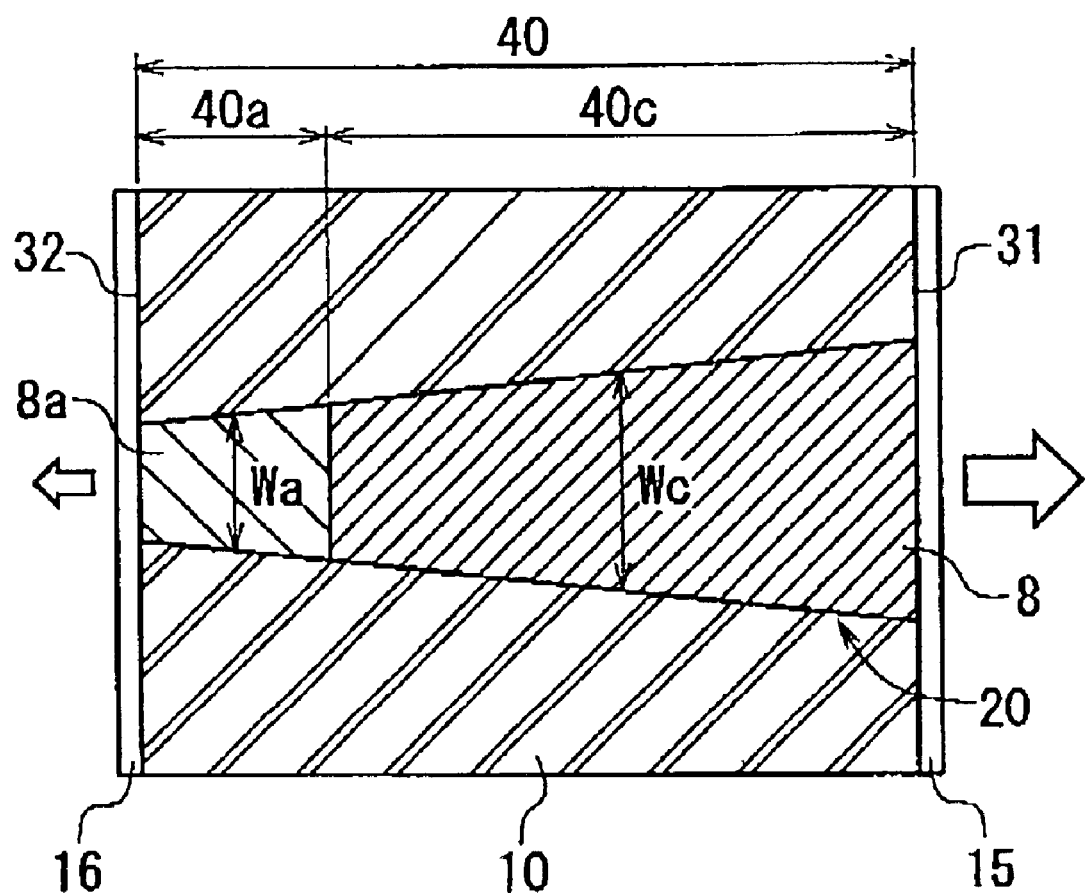
FIG. 33 is a horizontal, cross-sectional view showing the configuration of a semiconductor laser according to an eighth embodiment of the invention, which is along the line IV—IV in FIG. 3.

FIG. 33 shows the configuration of an edge emitting semiconductor laser (980 nm band) according to a seventh embodiment of the invention. This is a further variation of the waveguide 40 and is applicable to any the above-described first to fourth embodiments.

The laser of the eighth embodiment has the same configuration as the first embodiment except that the plan shape of the waveguide 40 is entirely tapered. Specifically, the waveguide 40 comprises a tapered part 40a (the fundamental mode section) with a relatively small width Wa, and a tapered part 40c (the multimode section) with a relatively large width Wc. These parts 40a and 40c are directly coupled to each other.

The current non-injection region 8a is formed to overlap with the whole tapered part 40a here. However, the length of the region 8a along the resonator may be optionally changeable according to the necessity.

With the laser of the eight embodiment, there is an additional advantage that the mode conversion in the waveguide 40 can be performed more smoothly than the first embodiment.

Ninth Embodiment

Figure 35:
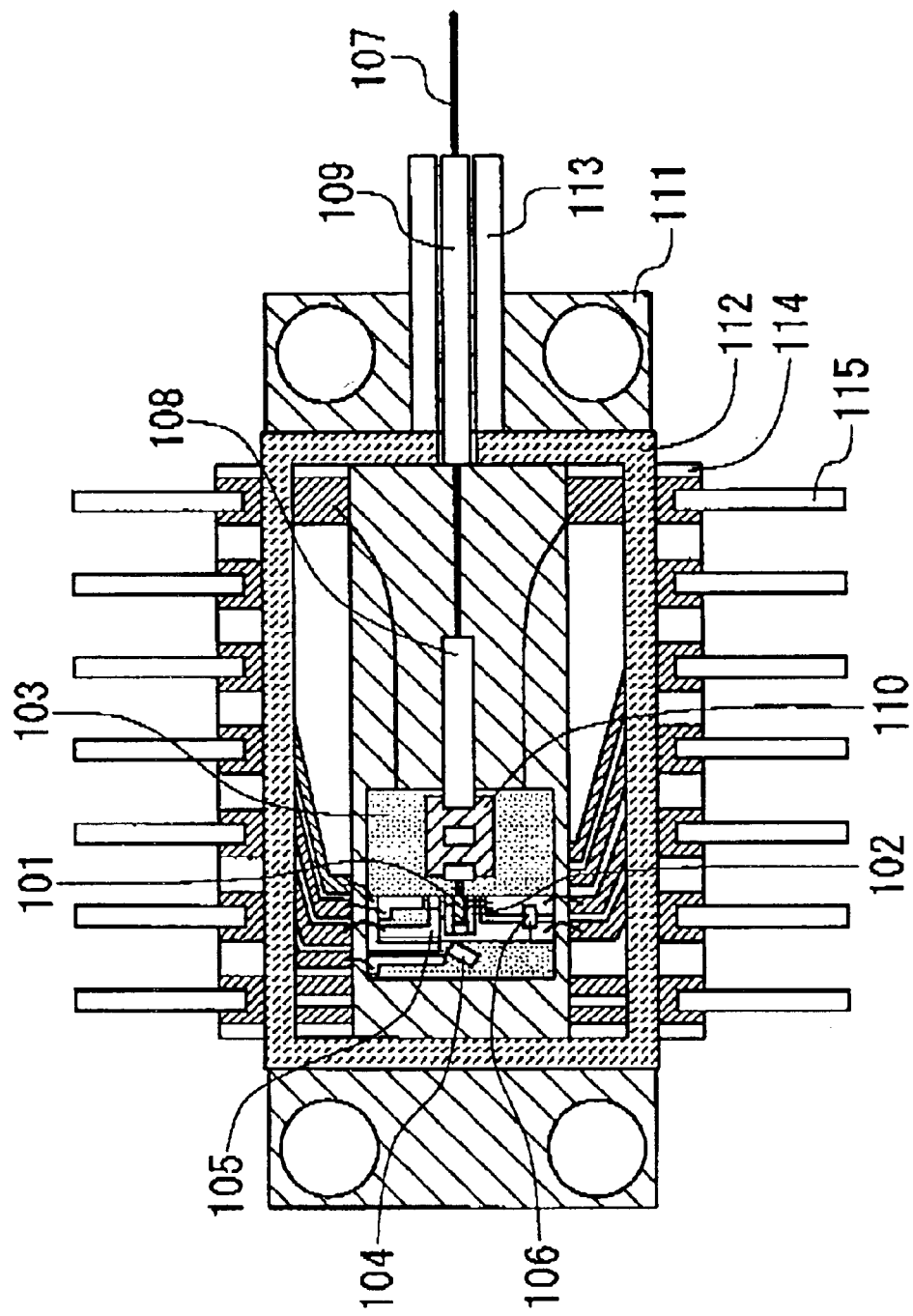
FIG. 35 is a schematic plan view showing the configuration of a semiconductor laser module according to a ninth fifth embodiment of the invention.

FIG. 35 shows the configuration of a laser module according to a ninth embodiment of the invention. This module comprises any one of the edge emitting semiconductor lasers according to the above-described first to eighth embodiments. The laser used is designed for being optically coupled with a cylindrical-lens fiber directly. The module has a butterfly package with 14 pins.

In FIG. 35, a semiconductor laser element 101, which has the same configuration as the laser according to any one of the first to eighth embodiments, is fixed on a heat sink 102 with solder. The sink 102 is made of a material with a high thermal conductivity, which is covered with a metal film. The sink 102 is fixed on a sub-mount 103 with solder along with a photodiode unit 104 for power monitoring, a thermistor 105 for temperature monitoring, and a ESD (electrostatic discharge) element 106 for surge absorbing. The ESD element 106 is provided to protect the laser element 101 against the surge voltage by bypassing the surge current when a reverse surge Voltage is applied.

In the base 111 of the butterfly package, a thermoelectric converter element (not shown) is fixed with solder. The sub-mount 103 is fixed to the top of the thermoelectric converter element. The electrodes of each element are connected to the wiring lines formed on the sub-mount 103 by the wire bonding method using gold (Au) wires. The wiring lines formed on the sub-mount 103 are connected to package electrodes 115 by way of a package insulating ceramic 114 in the same way as the electrodes.

A cylindrical-lens fiber 107 is a single-mode optical fiber with a cylindrical lens (not shown) for coupling at its end. The cylindrical lens is built in the end of the fiber 107. The fiber 107 is fixed to the package with a first ferrule 108 and a second ferrule 109. The near end of the fiber 107 is optically coupled with the laser element 101 within the package.

When the laser module according to the ninth embodiment is assembled, first, the laser element 101 is kept oscillating. Then, the near end of the fiber 107 is moved toward the emission point of the element 101 while monitoring the output light of the element 101 at the far end of the fiber 107. Thereafter, the positions of a metallic fixing member 110, the sub-mount 103, and the first ferrule 108 are successively adjusted and fixed in this order in such a way that the output light of the element 101 thus monitored is optimized. These fixing operations are carried out by laser welding. Subsequently, the second ferrule 109 and a package pipe 113 are sealed with proper solder. Finally, a lid or cover (not shown) is fixed to the top of a package frame 112 by resistance welding. As a result, the laser module of the ninth embodiment is completed.

Figure 38:
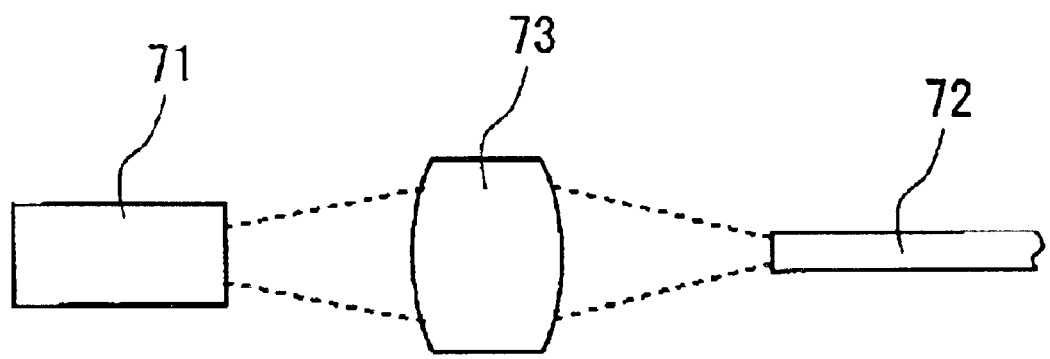
FIG. 38 is a schematic view showing the layout of the semiconductor laser element, the optical fiber, and the coupling lens in the laser module according to the ninth embodiment of the invention.

With the semiconductor laser module of the ninth embodiment, the cylindrical-lens fiber 107 having a coupling lens at its end (e.g., the fiber shown in FIGS. 36A to 36C) is used. However, an ordinary optical fiber with no integrated lens may be used for this purpose. In this case, a proper lens system (which is formed by a lens or lenses) is located between the emission edge of the laser element 101 and the opposing end of the fiber 107. For example, as shown in FIG. 38, a proper lens system 73 is located between the emission edge of the laser element 71 (101) and the opposing end of the optical fiber 72 (107). The output light of the element 101 is introduced into the inside of the fiber 107 by way of the lens system. In this case, an optical fiber with a built-in lens at its end may be used along with the lens system 73.

Variations

Needless to say, the present invention is not limited to the above-described first to ninth embodiments, because they are preferred examples of the invention. Any change or modification may be added to them within the spirit of the invention.

For examples the explanation for the above-described first to ninth embodiments relates to semiconductor lasers for the 980 nm band of wavelength. However, the invention may be applicable semiconductor lasers for any other wavelength band.

As the current injection suppressing means, any other type than those shown here may be applicable if it has a function of suppressing the current injection into the active layer in at least part of the fundamental mode section of the optical waveguide.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. An edge emitting semiconductor laser comprising:
    an optical waveguide including an active layer and a cladding layer, the waveguide serving as a resonator;
    a first edge to which one end of the waveguide is connected, the first edge serving as an emission edge;
    a second edge to which the other end of the waveguide is connected, the second edge being located at an opposite side to the first edge;
    the waveguide including at least two parts having different widths, one of the at least two parts being a fundamental mode section that allows a fundamental mode to propagate; and
    current injection suppressing means for suppressing current injection into the active layer in at least part of the fundamental mode section, said current injection suppressing means being located so as to overlay at least a portion of the fundamental mode section located on the longitudinal axis of the waveguide.

2. The laser according to claim 1, wherein the current injection suppressing means is made by a current blocking layer which overlaps with at least part of the fundamental mode section.

3. The laser according to claim 2, wherein the cladding layer of the waveguide has a depression, into which the current blocking layer is fitted.

4. The laser according to claim 3, wherein part of the cladding layer thinned by the depression is a current non-injection region.

5. The laser according to claim 1, wherein the current injection suppressing means is made by a current-limiting masking layer formed outside the waveguide in such a way as to overlap with at least part of the fundamental mode section.

6. The laser according to claim 5, wherein the laser further comprises a pair of electrodes and the current-limiting masking layer is located to be adjacent to at least one electrode of the laser.

7. The laser according to claim 5, wherein the current-limiting masking layer is made of a dielectric.

8. The laser according to claim 1, wherein the current injection suppressing means is a passive wave-guiding region formed to overlap with at least part of the fundamental mode section.

9. The laser according to claim 8, wherein the passive wave-guiding region has a band gap greater than an energy corresponding to an oscillation wavelength of the laser.

10. The laser according to claim 8, wherein the passive wave-guiding region is formed by ion-implanting a dopant into at least part of the fundamental mode section.

11. The laser according to claim 1, wherein the current injection suppressing means is located to be adjacent to the second edge.

12. The laser according to claim 1, wherein the current injection suppressing means is located to be adjacent to the second edge and a second current injection suppressing means is provided to be adjacent to the first edge.

13. The laser according to claim 1, wherein the fundamental mode section has a width of 3.5 µm or less;
    and wherein wider part of the waveguide than the fundamental mode section has a width of 4 µm or greater and is connected to the first edge at the same width.

14. The laser according to claim 1, wherein the fundamental mode section is connected to the second edge;
    and wherein a first wider part of the waveguide than the fundamental mode section is connected to the first edge.

15. The laser according to claim 14, wherein the fundamental mode section is directly connected to the first part.

16. The laser according to claim 14, wherein the fundamental mode section is connected to the first part by way of a second wider part of the waveguide than the fundamental mode section.

17. The laser according to claim 1, wherein a first wider part of the waveguide than the fundamental mode section is connected to the first edge and a second wider part of the waveguide than the fundamental mode section is connected to the second edge;
    and wherein edges of the fundamental mode section are connected to the first wider part and the second wider part, respectively.

18. The laser according to claim 1, wherein the waveguide is entirely tapered;
    and wherein the fundamental mode section is located on a narrow side of the waveguide, and a wider part of the waveguide than the fundamental mode section is located on the side of the waveguide opposite the fundamental mode section.

19. The laser according to claim 1, wherein a first wider part of the waveguide than the fundamental mode section is a multimode section that allows the fundamental mode and its higher modes;
    and wherein the fundamental mode section is directly connected to the multimode section.

20. The laser according to claim 1, wherein a first wider part of the waveguide than the fundamental mode section is a multimode section that allows the fundamental mode and its higher modes;

and wherein the fundamental mode section is connected to the multimode section by way of a second wider part of the waveguide than the fundamental mode section.

21. A semiconductor laser module comprising:

a semiconductor laser element according to claim 1; and a fiber fixing means for fixing an end of an optical fiber in such a way as to be adjacent to the first edge of the laser element.

22. The module according to claim 21, wherein the module is designed in such a way that an optical fiber having a coupling lens integrally formed at its end is connectable.

23. The module according to claim 21, wherein the module is designed in such a way that output light of the laser element is introduced into an optical fiber by way of an external coupling lens.

24. The module according to claim 23, wherein the optical fiber has a built-in coupling lens at its end.

* * * * *